(12) United States Patent
Wu et al.

(10) Patent No.: US 12,413,185 B2
(45) Date of Patent: Sep. 9, 2025

(54) ELECTRONIC DEVICE

(71) Applicant: Innolux Corporation, Miaoli County (TW)

(72) Inventors: Yan-Zheng Wu, Miaoli County (TW); Ming-Sheng Lai, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 205 days.

(21) Appl. No.: 17/955,510

(22) Filed: Sep. 28, 2022

(65) Prior Publication Data

US 2023/0118076 A1 Apr. 20, 2023

(30) Foreign Application Priority Data

Oct. 20, 2021 (CN) .......................... 202111223320.X

(51) Int. Cl.
| | |
|---|---|
| *H03C 7/02* | (2006.01) |
| *H01P 3/12* | (2006.01) |
| *H03C 3/00* | (2006.01) |
| *H03H 7/00* | (2006.01) |
| *H04B 1/04* | (2006.01) |

(52) U.S. Cl.
CPC ............... *H03C 7/02* (2013.01); *H01P 3/12* (2013.01); *H03C 3/00* (2013.01); *H03H 7/00* (2013.01); *H04B 1/04* (2013.01)

(58) Field of Classification Search
CPC .... H03C 7/02; H03C 3/00; H01P 3/12; H03H 7/00; H04B 1/04
USPC .......................................................... 332/185
See application file for complete search history.

(56) References Cited

U.S. PATENT DOCUMENTS

| | | | |
|---|---|---|---|
| 8,253,508 B2* | 8/2012 | Bostak ..................... | H03C 1/34 |
| | | | 332/174 |
| 2012/0025800 A1* | 2/2012 | Dettloff ............... | H04L 25/0272 |
| | | | 323/299 |
| 2017/0257066 A1* | 9/2017 | Saputra .................... | H03B 5/04 |
| 2020/0153475 A1 | 5/2020 | Tsai et al. | |
| 2021/0050671 A1 | 2/2021 | Stevenson et al. | |

FOREIGN PATENT DOCUMENTS

| | | |
|---|---|---|
| CN | 106027056 | 10/2016 |
| WO | 2013188712 | 12/2013 |

OTHER PUBLICATIONS

"Search Report of Europe Counterpart Application", issued on Mar. 15, 2023, p. 1-p. 9.
"Office Action of China Counterpart Application", issued on Jul. 17, 2025, p. 1-p. 8.

* cited by examiner

*Primary Examiner* — Richard Tan
(74) *Attorney, Agent, or Firm* — JCIPRNET

(57) ABSTRACT

An electronic device, including a substrate and multiple modulation units, is provided. The modulation units are disposed on the substrate. Each modulation unit includes a first electronic element, a second electronic element, a first signal line, a second signal line, and a third signal line. The first signal line provides a first voltage to the first electronic element. The second signal line provides a second voltage to the second electronic element. The third signal line provides a third voltage to the first electronic element and/or the second electronic element. The first voltage is different from the second voltage, and the third voltage is different from the first voltage and/or the second voltage.

15 Claims, 17 Drawing Sheets

ELECTRONIC DEVICE

CROSS-REFERENCE TO RELATED APPLICATION

This application claims the priority benefit of China application serial no. 202111223320.X, filed on Oct. 20, 2021. The entirety of the above-mentioned patent application is hereby incorporated by reference herein and made a part of this specification.

BACKGROUND

Technical Field

The disclosure relates to an electronic device, and in particular to an electronic device having a modulation unit capable of modulating a phase, a bandwidth, an intensity, or a polarization state of an electromagnetic wave.

Description of Related Art

Electronic devices or splicing electronic devices have been widely used in mobile phones, televisions, monitors, tablet computers, car displays, wearable devices, and desktop computers. With the vigorous development of electronic devices, the quality requirements for electronic devices are increasing, and such electronic products can often be used as electronic modulation devices at the same time, for example, as antenna devices that can modulate electromagnetic waves. However, the existing antenna devices still do not meet the requirements of consumers in all aspects.

SUMMARY

The disclosure provides an electronic device having a modulation unit capable of modulating a phase, a bandwidth, an intensity, or a polarization state of an electromagnetic wave.

According to an embodiment of the disclosure, the electronic device includes a substrate and multiple modulation units. The modulation units are disposed on the substrate. Each modulation unit includes a first electronic element, a second electronic element, a first signal line, a second signal line, and a third signal line. The first signal line provides a first voltage to the first electronic element. The second signal line provides a second voltage to the second electronic element. The third signal line provides a third voltage to the first electronic element and/or the second electronic element. The first voltage is different from the second voltage, and the third voltage is different from the first voltage and/or the second voltage.

BRIEF DESCRIPTION OF THE DRAWINGS

The drawings are included to provide a further understanding of the disclosure, and the drawings are incorporated into the specification and constitute a part of the specification. The drawings illustrate embodiments of the disclosure and serve to explain principles of the disclosure together with the description.

DETAILED DESCRIPTION OF DISCLOSED EMBODIMENTS

Figure 1A:
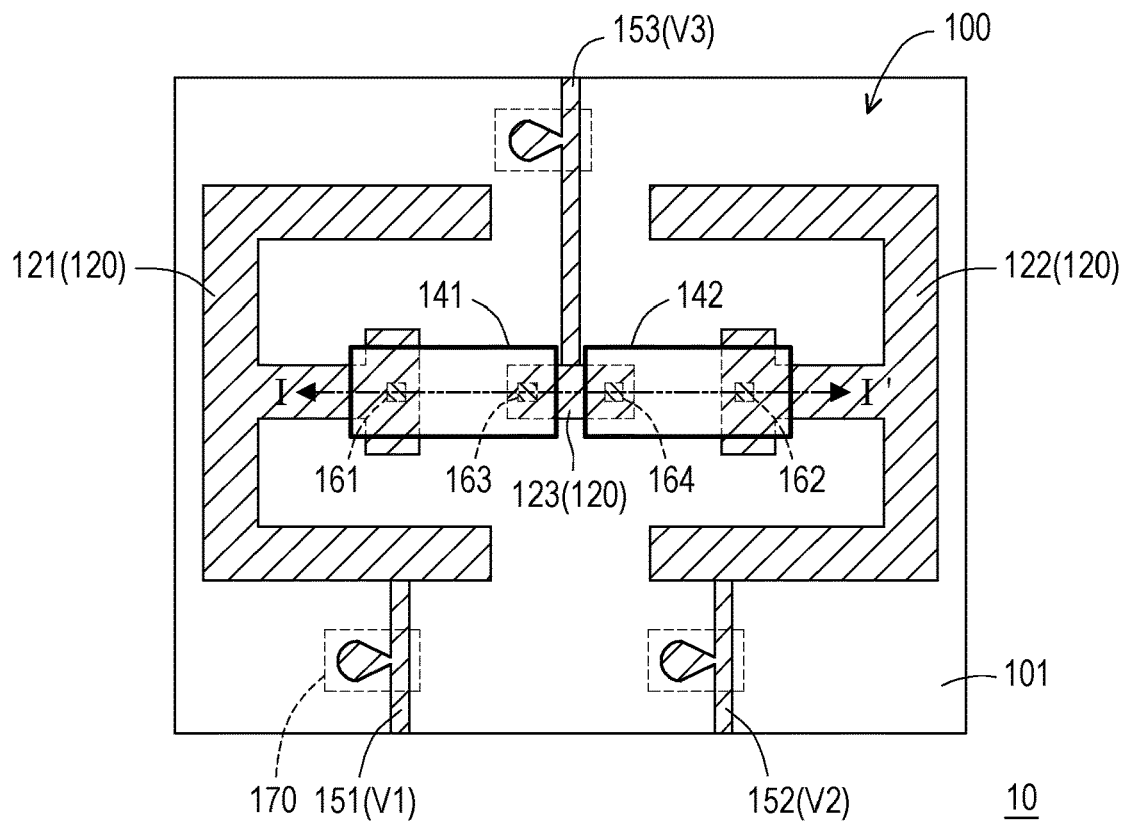
FIG. 1A is a schematic partial top view of an electronic device according to an embodiment of the disclosure.

The disclosure may be understood by referring to the following detailed description in conjunction with the drawings. It should be noted that in order to facilitate understanding by the reader and the simplicity of the drawings, multiple drawings in the disclosure only depict a part of an electronic device, and specific elements in the drawings are not drawn according to actual scale. In addition, the number and the size of each element in the drawings are for illustration only and are not intended to limit the scope of the disclosure.

In the following description and claims, words such as "comprising" and "including" are open-ended words, so the words should be interpreted as meaning "comprising but not limited to . . . ".

It will be understood that when an element or a film layer is referred to as being "on" or "connected to" another element or film layer, the element or the film layer may be directly on the other element or film layer or directly connected to the other element or film layer, or there may be an intervening element or film layer between the two (indirect case). In contrast, when an element is referred to as being "directly on" or "directly connected to" another element or film layer, there is no intervening element or film layer between the two.

Although the terms "first", "second", "third" . . . may be used to describe various constituent elements, the constituent elements are not limited by the terms. The terms are only used to distinguish a single constituent element from other constituent elements in the specification. The same terms may not be used in the claims, but replaced by first, second, third . . . according to the order in which the elements are declared in the claims. Therefore, a first constituent element in the following specification may be a second constituent element in the claims.

In the text, the terms "about", "approximately", "substantially", and "roughly" generally mean within 0.5%, 1%, 2%, 3%, 5%, or 10% of a given value or range. The number given here is an approximate number, that is, the meaning of "about", "approximately", "substantially", or "roughly" may still be implied without the specific description of "about", "approximately", "substantially", and "roughly".

In some embodiments of the disclosure, terms related to bonding and connection such as "connection" and "interconnection" may mean that two structures are in direct contact or may also mean that two structures are not in direct contact, wherein there is another structure disposed between the two structures, unless otherwise defined. Also, the terms related to bonding and connection may also include the case where the two structures are both movable or the two structures are both fixed. Furthermore, the term "coupling" includes any direct and indirect means of electrical connection.

The electronic device may include a display device, an antenna device (for example, a liquid crystal antenna), a sensing device, a light emitting device, a touch device, or a splicing device, but not limited thereto. The electronic device may include a bendable or flexible electronic device. The appearance of the electronic device may be rectangular, circular, polygonal, a shape with curved edges, or other suitable shapes. The display device may, for example, include a light emitting diode (LED), liquid crystal, fluorescence, phosphor, quantum dot (QD), other suitable materials, or a combination of the foregoing, but not limited thereto. The light emitting diode may include, for example, an organic light emitting diode (OLED), an inorganic light emitting diode, a mini LED, a micro LED, a QDLED, other suitable materials, or any combination of the foregoing, but not limited thereto. The display device may also include, for example, a splicing display device, but not limited thereto. The antenna device may be, for example, a liquid crystal antenna, but not limited thereto. The antenna device may include, for example, an antenna splicing device, but not limited thereto. It should be noted that the electronic device may be any combination of the foregoing, but not limited thereto. In addition, the appearance of the electronic device may be rectangular, circular, polygonal, a shape with curved edges, or other suitable shapes. The electronic device may have a peripheral system such as a driving system, a control system, a light source system, and a shelf system to support the display device, the antenna device, or the splicing device. The disclosure will be described below with the electronic device, but the disclosure is not limited thereto.

It should be noted that in the following embodiments, features in several different embodiments may be replaced, recombined, and mixed to complete other embodiments without departing from the spirit of the disclosure. As long as the features between various embodiments do not violate the spirit of the invention or conflict with each other, the features may be mixed and matched arbitrarily.

Reference will now be made in detail to the exemplary embodiments of the disclosure, examples of which are illustrated in the drawings. Wherever possible, the same reference numerals are used in the drawings and the description to refer to the same or similar parts.

Figure 1B:
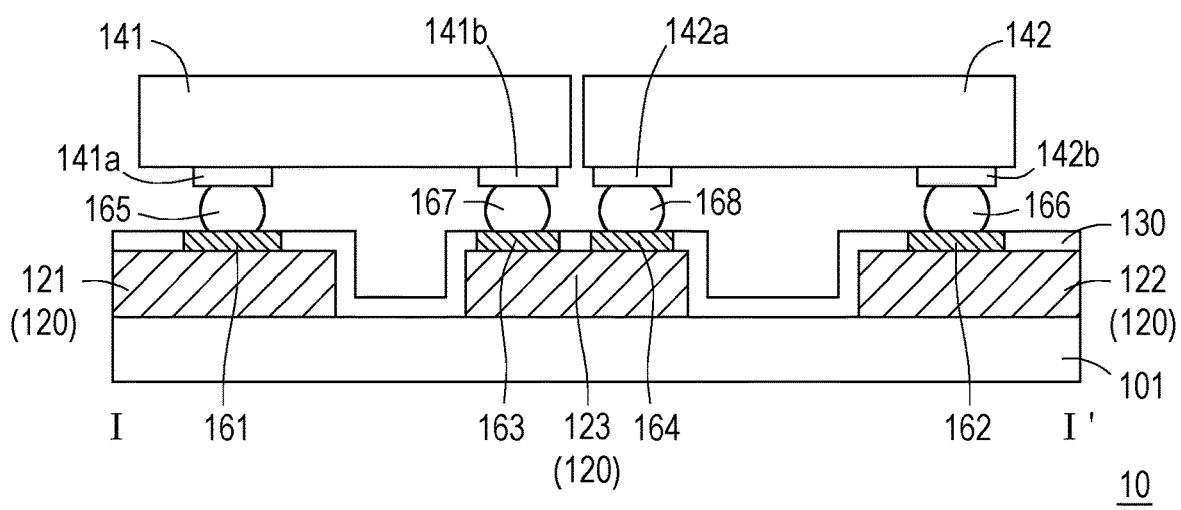
FIG. 1B is a schematic cross-sectional view of the electronic device of FIG. 1A along a section line I-I'.

FIG. 1A is a schematic partial top view of an electronic device according to an embodiment of the disclosure. FIG. 1B is a schematic cross-sectional view of the electronic device of FIG. 1A along a section line I-I'. For the clarity of the drawings and the convenience of description, FIG. 1A omits to show several elements in an electronic device 10.

Please refer to FIG. 1A and FIG. 1B at the same time. The electronic device 10 of this embodiment includes a substrate 101 and multiple modulation units 100. The modulation units 100 are disposed on the substrate 101 and are used to modulate an intensity, a bandwidth, or a phase of a received electromagnetic wave signal (or light signal, but not limited thereto). Specifically, each modulation unit 100 includes a first conductive layer pattern 120, a first insulation layer 130, a first electronic element 141, a second electronic element 142, a first signal line 151, a second signal line 152, and a third signal line 153. The substrate 101 may include a hard substrate, a soft substrate, or a combination of the foregoing. For example, the material of the substrate 101 may include glass, quartz, silicon wafer, sapphire, III-V semiconductor material, ceramics, polycarbonate (PC), polyimide (PI), polyethylene terephthalate (PET), other suitable substrate materials, or a combination of the foregoing, but not limited thereto. In some embodiments, the substrate 101 may be a printed circuit board.

In this embodiment, a conductive layer including the first conductive layer pattern 120 is disposed on the substrate 101. The first conductive layer pattern 120 includes a first part 121, a second part 122, and a third part 123. The first part 121, the second part 122, and the third part 123 are separated from each other. The third part 123 is located between the first part 121 and the second part 122. In this embodiment, the first conductive layer pattern 120 may resonate with the received electromagnetic wave signal (or light signal). The material of the first conductive layer pattern 120 may include copper, aluminum, silver, gold, indium tin oxide (ITO), metal alloy, other suitable conductive materials, or a combination of the foregoing materials, but not limited thereto.

In this embodiment, in the schematic top view of the modulation unit 100 (as shown in FIG. 1A), the pattern of the first conductive layer pattern 120 may include the pattern of the first part 121, the pattern of the second part 122, and the pattern of the third part 123. The pattern of the first part 121 and the pattern of the second part 122 may be regarded as E-shaped, and the pattern of the third part 123 may be regarded as a solid square shape, but not limited thereto. The pattern of the first part 121, the pattern of the second part 122, and the pattern of the third part 123 are separated from each other. The pattern of the first part 121 and the pattern of the second part 122 may surround the pattern of the third part 123, and the pattern of the first part 121 and the pattern of the second part 122 may be disposed on two sides of the pattern of the third part 123 in a mirroring manner, but not limited thereto.

In this embodiment, the first part of the insulation layer, that is, the first insulation layer 130 is disposed on the first conductive layer pattern 120 to cover a part of the first conductive layer pattern 120 and cover a part of the substrate 101 exposed by an opening between the first conductive layer patterns 120. The first insulation layer 130 may expose another part of the first conductive layer pattern 120 for disposing a bonding pad 161, a bonding pad 162, a bonding pad 163, and a bonding pad 164. In this embodiment, the first insulation layer 130 may be a single-layer or multi-layer structure, and the material of the first insulation layer 130 may include a polymer thin film, silicon nitride, silicon oxide, silicon oxynitride, or a combination of the foregoing, but not limited thereto.

In this embodiment, each modulation unit 100 further includes a bonding pad 161, a bonding pad 162, a bonding pad 163, and a bonding pad 164, wherein the bonding pad 161 and the bonding pad 163 are respectively disposed between the first conductive layer pattern 120 and the first electronic element 141, and the bonding pad 162 and the bonding pad 164 are respectively disposed between the first conductive layer pattern 120 and the second electronic element 142. The bonding pad 161 is disposed on the first part 121 of the first conductive layer pattern 120 to contact the first part 121. The bonding pad 162 is disposed on the second part 122 of the first conductive layer pattern 120 to contact the second part 122. The bonding pad 163 and the bonding pad 164 are respectively disposed on the third part 123 of the first conductive layer pattern 120 to contact the third part 123. In this embodiment, the materials of the bonding pad 161, the bonding pad 162, the bonding pad 163, and the bonding pad 164 may include copper, aluminum, silver, gold, indium tin oxide, metal alloys (for example, electroless nickel immersion gold (ENIG)), other suitable conductive materials, or a combination of the foregoing materials, but not limited thereto.

In this embodiment, each modulation unit 100 further includes multiple solder balls 165, 166, 167, and 168, which are respectively disposed on the bonding pad 161, the bonding pad 162, the bonding pad 163, and the bonding pad 164. The solder ball 165 may contact the bonding pad 161, the solder ball 166 may contact the bonding pad 162, the solder ball 167 may contact the bonding pad 163, and the solder ball 168 may contact the bonding pad 164.

In this embodiment, the first electronic element 141 and the second electronic element 142 are disposed on the first signal line 151, the second signal line 152, and the third signal line 153. The first electronic element 141 has a pad 141a and a pad 141b, and the second electronic element 142 has a pad 142a and a pad 142b. The first electronic element 141 may be bonded to the bonding pad 161 through the pad 141a and the solder ball 165, and may be bonded to the bonding pad 163 through the pad 141b and the solder ball 167. The second electronic element 142 may be bonded to the bonding pad 162 through the pad 142a and the solder ball 166, and may be bonded to the bonding pad 164 through the pad 142b and the solder ball 168. In other words, the first electronic element 141 may be bonded to the first conductive layer pattern 120 through the bonding pad 161 and the bonding pad 163, and the second electronic element 142 may be bonded to the first conductive layer pattern 120 through the bonding pad 162 and the bonding pad 164.

In this embodiment, the first electronic element 141 and the second electronic element 142 may have the characteristic of being sensitive to external stimuli, and the first electronic element 141 and the second electronic element 142 may be regulated by the external stimuli to change their own characteristics, wherein the external stimulus is, for example, voltage, current, temperature, etc., and their own characteristic is, for example, a capacitance value or a resistance value, but not limited thereto. In this embodiment, the first electronic element 141 and the second electronic element 142 may include, for example, capacitors, inductors, or resistors, but not limited thereto. For example, when the first electronic element 141 and/or the second electronic element 142 are capacitors, the modulation unit 100 may regulate the capacitors by applying voltages to change the capacitance values of the capacitors.

In addition, in some embodiments, the first electronic element 141 and the second electronic element 142 may also be, for example, electronic elements containing materials sensitive to external stimuli, electronic elements containing elements sensitive to external stimuli, or electronic elements containing structures sensitive to external stimuli. The material sensitive to external stimuli may be, for example, liquid crystal, vanadium oxide, etc., the element sensitive to external stimuli may be, for example, a PIN diode, a varactor diode, a Schottky diode, a Gunn diode, etc., the structure sensitive to external stimuli may be, for example, micro electro mechanical systems (MEMS), etc., but not limited thereto.

In addition, in some embodiments, the first electronic element 141 and the second electronic element 142 may also be different electronic elements. For example, the first electronic element 141 may be an inductor and the second electronic element 142 may be a capacitor or the first electronic element 141 may be a switching element and the second electronic element 142 may be a diode. Therefore, one modulation element may modulate two different characteristics.

In this embodiment, the first signal line 151, the second signal line 152, and the third signal line 153 are respectively disposed on the substrate 101 and the first insulation layer 130. The first signal line 151, the second signal line 152, and the third signal line 153 may be the same film layer as the first conductive layer pattern 120, but not limited thereto. The first signal line 151 may contact and be coupled to the first part 121 of the first conductive layer pattern 120, the second signal line 152 may contact and be coupled to the second part 122 of the first conductive layer pattern 120, and the third signal line 153 may contact and be coupled to the third part 123 of the first conductive layer pattern 120.

In this embodiment, the first signal line 151 has a first voltage V1, the second signal line 152 has a second voltage V2, and the third signal line 153 has a third voltage V3. The first voltage V1, the second voltage V2, and the third voltage V3 are low frequency voltage signals, for example, the frequency range is 0 to 100 MHz. The first signal line 151 may provide the first voltage V1 to the first electronic element 141 through the first part 121, the bonding pad 161, the solder ball 165, and the pad 141a. The second signal line 152 may provide the second voltage V2 to the second electronic element 142 through the second part 122, the bonding pad 162, the solder ball 165, and the pad 142b. The third signal line 153 may provide the third voltage V3 to the first electronic element 141 through the third part 123, the bonding pad 163, the solder ball 165, and the pad 141b, and provide the third voltage V3 to the second electronic element 142 through the third part 123, the bonding pad 164, the solder ball 165, and the pad 142a. Therefore, in this embodiment, the first electronic element 141 may be regulated and the own characteristics of the first electronic element 141 may be changed using the third voltage V3 of the third signal line 153 matched with the first voltage V1 of the first signal line 151 or the second electronic element 142 may be regulated and the own characteristics of the second electronic element 142 may be changed using the third voltage V3 of the third signal line 153 matched with the second voltage V2 of the second signal line 152. In this way, the modulation unit 100 may modulate the phase, the intensity, the bandwidth, or the polarization state of the received electromagnetic wave signal (or light signal, but not limited thereto), and output the modulated electromagnetic wave signal (or light signal, but not limited thereto).

In addition, in this embodiment, a voltage difference (that is, a difference value between the first voltage V1 and the third voltage V3) in the first electronic element 141 and a voltage difference (that is, a difference value between the first voltage V1 and the second voltage V2) in the second electronic element 142 may be independently regulated by the first signal line 151, the second signal line 152, and/or the third signal line 153. In this embodiment, since the first electronic element 141 and the second electronic element 142 may share the third voltage V3 of the third signal line 153, the overall circuit configuration of the modulation unit 100 can be relatively simple and not complicated. In this embodiment, since the first voltage V1 may be different from the second voltage V2, and the third voltage V3 may be different from the first voltage V1 and the second voltage V2, the regulated first electronic element 141 and second electronic element 142 may respectively display various different characteristics, thereby increasing the modulable factor of the modulation unit 100 or increasing the selection of the first electronic element 141 and the second electronic element 142.

In this embodiment, since the first signal line 151, the second signal line 152, and the third signal line 153 may be respectively electrically connected to the first conductive layer pattern 120, each modulation unit 100 needs to be additionally provided with multiple radio frequency chokes 170 to block a high frequency signal or an alternating current voltage in the first conductive layer pattern 120 from entering (or interfering with) the first signal line 151, the second signal line 152, and the third signal line 153 with low frequency signals or direct current voltages. Specifically, the radio frequency chokes 170 are respectively disposed in the first signal line 151, the second signal line 152, and the third signal line 153 to stabilize the first voltage V1, the second voltage V2, and the third voltage V3.

Although the first voltage V1, the second voltage V2, and the third voltage V3 in this embodiment are all different from each other, the disclosure is not limited thereto. In other words, in some embodiments, the voltages of any two of the first voltage, the second voltage, and the third voltage may be different.

Figure 6:
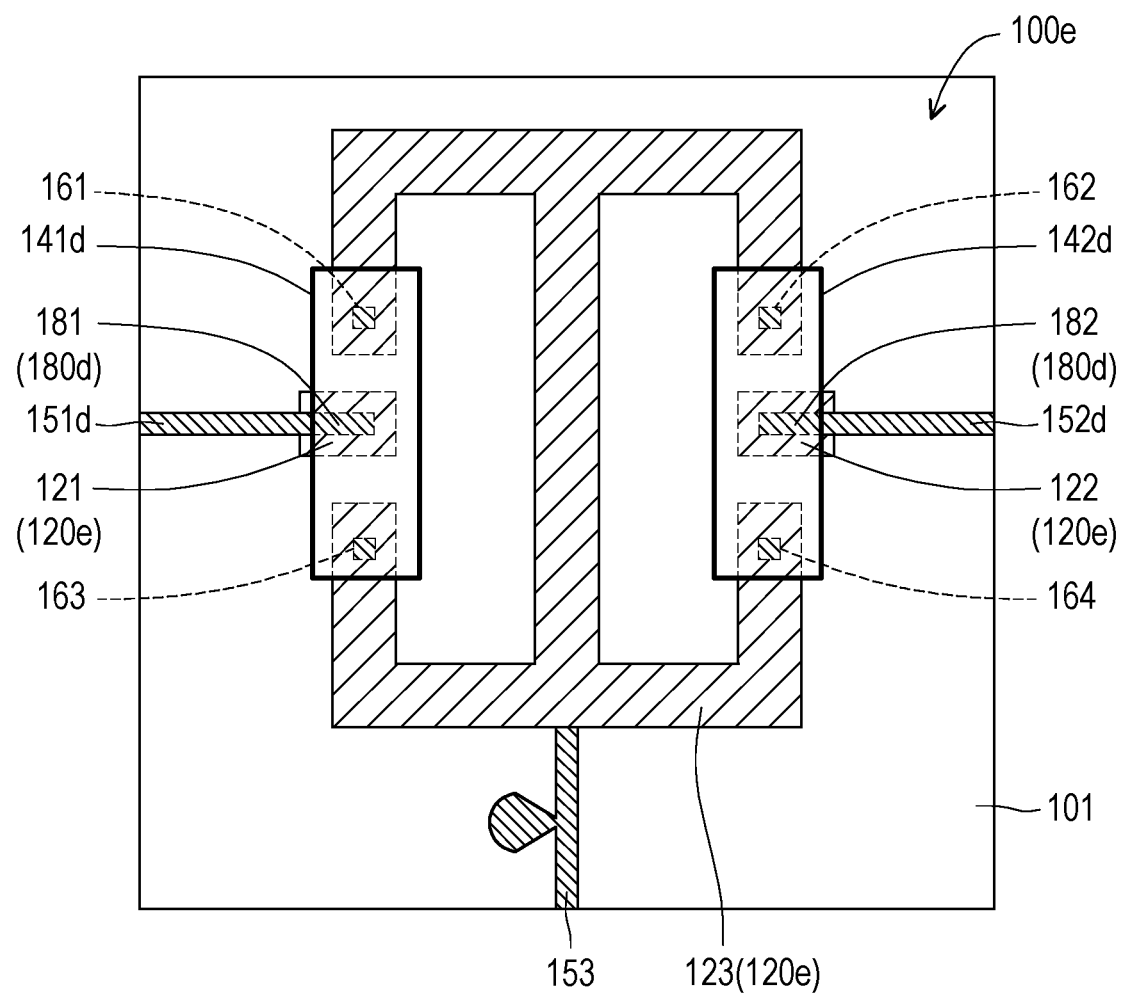
FIG. 6 is a schematic partial top view of an electronic device according to another embodiment of the disclosure.

Although the first signal line 151, the second signal line 152, and the third signal line 153 in this embodiment may be the same film layer as the first conductive layer pattern 120, the disclosure is not limited thereto. In other words, in some embodiments, the first signal line, the second signal line, and the third signal line may also be different film layers from the first conductive layer pattern, as shown in FIG. 2A, FIG. 2B, FIG. 3A, and FIG. 3B. In some embodiments, one or two of the first signal line, the second signal line, and the third signal line may be the same film layer as the first conductive layer pattern, and the other one or the other two of the signal lines may be different film layers from the first conductive layer pattern, as shown in FIG. 6.

In this embodiment, in the schematic top view of the modulation unit 100 (as shown in FIG. 1A), although the shapes of the contours of the first signal line 151, the second signal line 152, and the third signal line 153 are straight lines, the disclosure is not limited thereto. In some embodiments, the shapes of the contours of the first signal line, the second signal line, and the third signal line may also be wavy structures or loop structures.

Other embodiments are listed below for illustration. It must be noted here that the following embodiments continue to use the reference numerals and some contents of the foregoing embodiment, wherein the same reference numeral is adopted to represent the same or similar elements, and the description of the same technical content is omitted. For the description of the omitted part, reference may be made to the foregoing embodiment, which will not be repeated in the following embodiments.

Figure 2A:
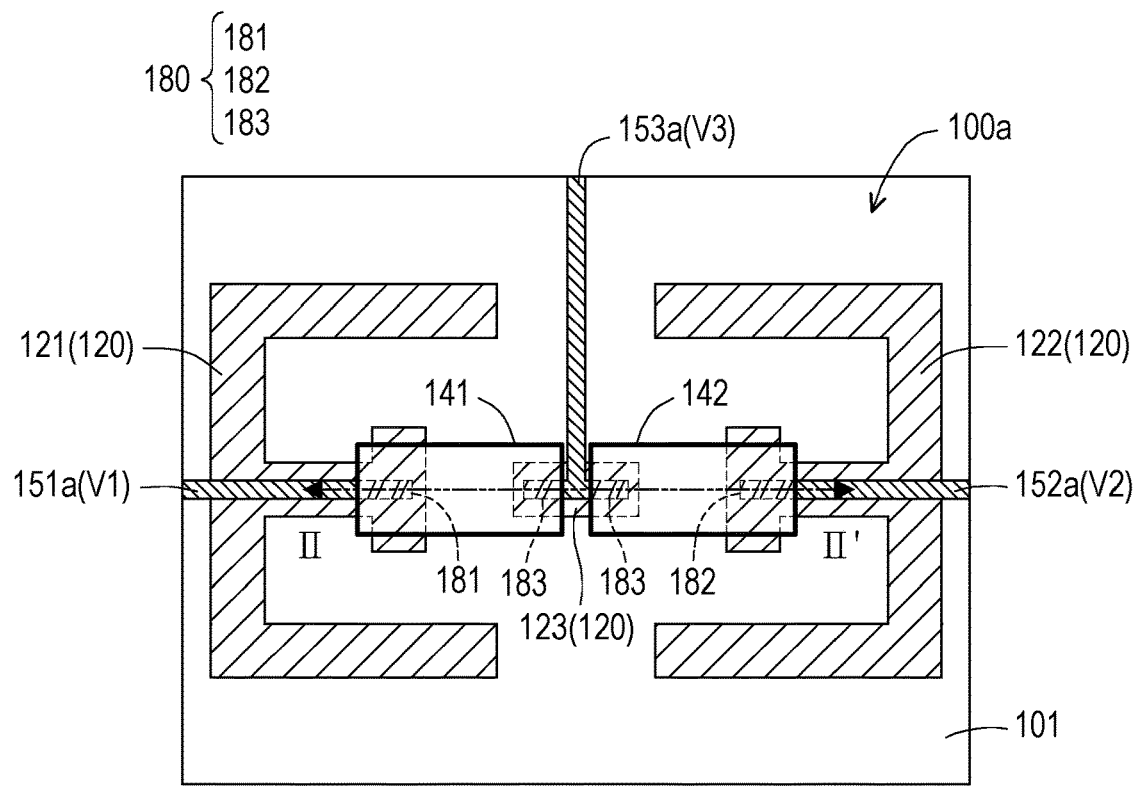
FIG. 2A is a schematic partial top view of an electronic device according to another embodiment of the disclosure.
Figure 2B:
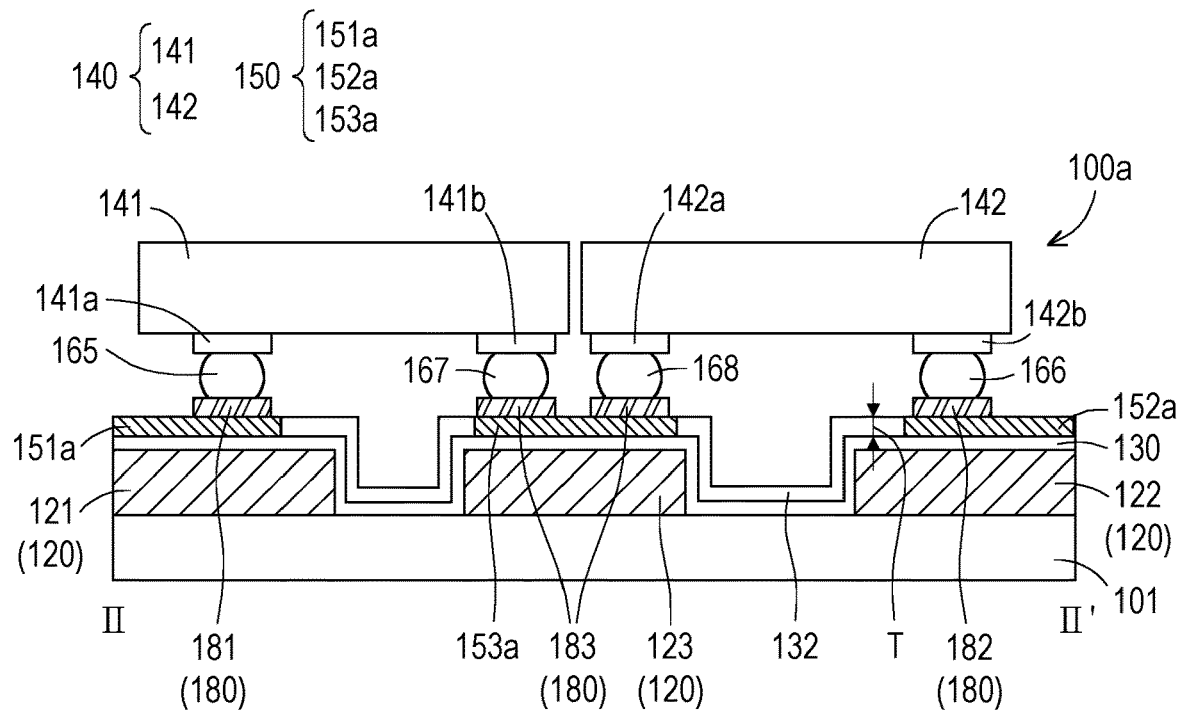
FIG. 2B is a schematic cross-sectional view of the electronic device of FIG. 2A along a section line II-II'.

FIG. 2A is a schematic partial top view of an electronic device according to another embodiment. FIG. 2B is a schematic cross-sectional view of the electronic device of FIG. 2A along a section line II-II'. Please refer to FIG. 1A, FIG. 1B, FIG. 2A, and FIG. 2B at the same time. A modulation unit 100a of this embodiment is substantially similar to the modulation unit 100 of FIG. 1A to FIG. 1B, so the same and similar components in the two embodiments are not repeated here. The modulation unit 100a of this embodiment is different from the modulation unit 100 in that each modulation unit 100a of this embodiment further includes a second insulation layer 132 and a second conductive layer pattern 180.

Specifically, please refer to FIG. 2A and FIG. 2B. In this embodiment, a section of another insulation layer, that is, the second insulation layer 132 is disposed on the first insulation layer 130 to cover at least one part of the first insulation layer 130 and expose another part of the first insulation layer 130. The second insulation layer 132 may be a single-layer or multi-layer structure, and the material of the second insulation layer 132 may include a polymer thin film, silicon nitride, silicon oxide, silicon oxynitride, or a combination of the foregoing, but not limited thereto.

In this embodiment, a first signal line 151a, a second signal line 152a, and a third signal line 153a are disposed on the first insulation layer 130 exposed by the second insulation layer 132, so that the first signal line 151a is physically separated from the first part 121, the second signal line 152a is physically separated from the second part 122, and the third signal line 153a is physically separated from the third part 123. The second conductive layer pattern 180 is disposed on the first signal line 151a, the second signal line 152a, and the third signal line 153a. In other words, the second conductive layer pattern 180 may be disposed between a signal line 150 and an electronic element 140, wherein the signal line 150 includes the first signal line 151a, the second signal line 152a, and the third signal line 153a, and the electronic element 140 includes the first electronic element 141 and the second electronic element 142. The second conductive layer pattern 180 includes a first pad 181, a second pad 182, and a third pad 183 that are separated from each other. The first pad 181 may be disposed corresponding to the first part 121, the second pad 182 may be disposed corresponding to the second part 122, and the third pad 183 may be disposed corresponding to the third part 123.

In this embodiment, the first signal line 151a may contact and be electrically connected to the first pad 181, the second signal line 152a may contact and be electrically connected to the second pad 182, and the third signal line 153a may contact and be electrically connected to the third pad 183. The first pad 181 may be electrically connected to the first signal line 151a and the first electronic element 141, the second pad 182 may be electrically connected to the second signal line 152a and the second electronic element 142, and the third pad 183 may be electrically connected to the third signal line 153a and the first electronic element 141 and/or the second electronic element 142.

In this embodiment, since the high frequency signal or the alternating current voltage in the first conductive layer pattern 120 will not enter (or interfere with) the first signal line 151a, the second signal line 152a, and the third signal line 153a with low frequency signals or direct current voltages, each modulation unit 100a does not need to be additionally provided with multiple radio frequency chokes.

In this embodiment, since the first conductive layer pattern 120 is indirectly electrically connected to the first electronic element 141 and the second electronic element 142, the first electronic element 141 and the second electronic element 142 need to regulate an electromagnetic wave signal (or a light signal, but not limited to) between the first conductive layer patterns 120 through induction.

In this embodiment, a thickness T of the first insulation layer 130 may be 100 angstroms (Å) to 10 micrometers (μm), wherein the thickness T is the minimum thickness of the first insulation layer 130 measured along a normal direction of the substrate 101.

Figure 3A:
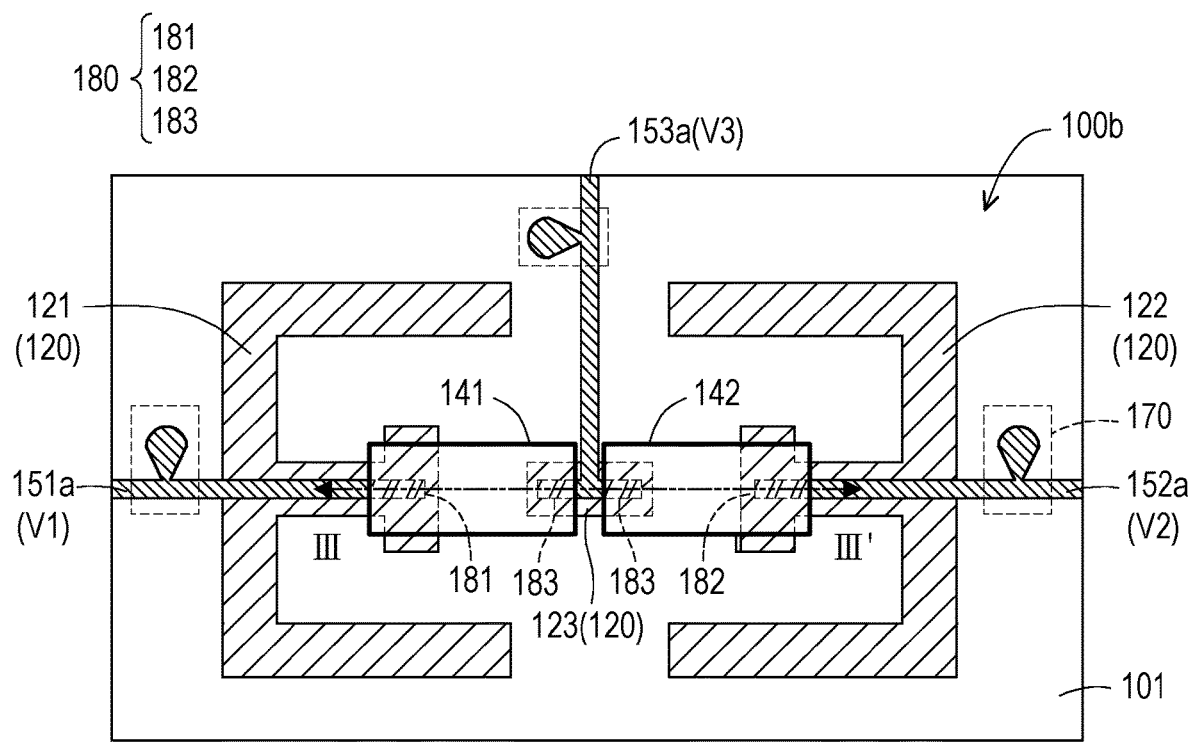
FIG. 3A is a schematic partial top view of an electronic device according to another embodiment of the disclosure.
Figure 3B:
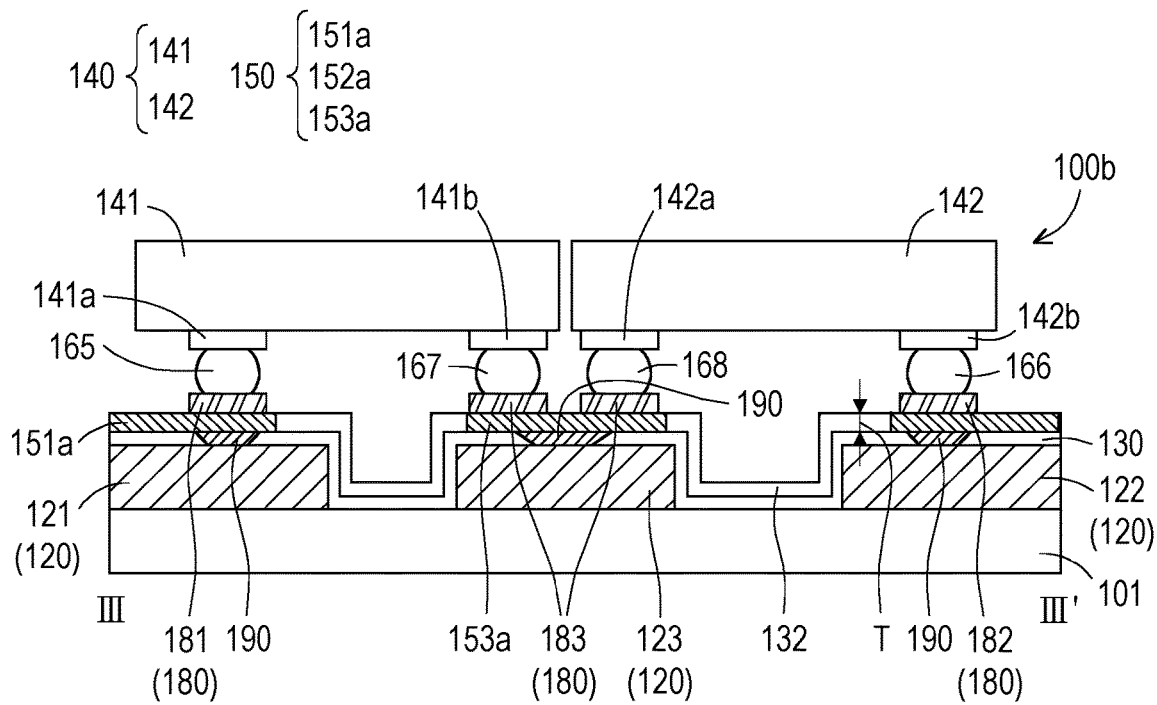
FIG. 3B is a schematic cross-sectional view of the electronic device of FIG. 3A along a section line III-III'.

FIG. 3A is a schematic partial top view of an electronic device according to another embodiment of the disclosure. FIG. 3B is a schematic cross-sectional view of the electronic device of FIG. 3A along a section line III-III'. Please refer to FIG. 2A, FIG. 2B, FIG. 3A, and FIG. 3B at the same time. A modulation unit 100b of this embodiment is substantially similar to the modulation unit 100a of FIG. 2A and FIG. 2B, so the same and similar components in the two embodiments are not repeated here. The modulation unit 100b of this embodiment is different from the modulation unit 100a in that each modulation unit 100b in this embodiment further includes a conductive hole 190.

Specifically, please refer to FIG. 3A and FIG. 3B. In this embodiment, the conductive hole 190 may penetrate the first insulation layer 130 and electrically connect the second conductive layer pattern 180 and the first conductive layer pattern 120. Since the first signal line 151a, the second signal line 152a, and the third signal line 153a may be electrically connected to the first conductive layer pattern 120 through the second conductive layer pattern 180 and the conductive hole 190, the modulation unit 100b of this embodiment needs to be additionally provided with multiple radio frequency chokes 170 in the first signal line 151a, the second signal line 152a, and the third signal line 153a.

In addition, since the first conductive layer pattern 120 may be electrically connected to the first electronic element 141 and the second electronic element 142 through the conductive hole 190 and the second conductive layer pattern 180, the modulation unit 100b of this embodiment does not need to limit the thickness of the first insulation layer 130.

Figure 4A:
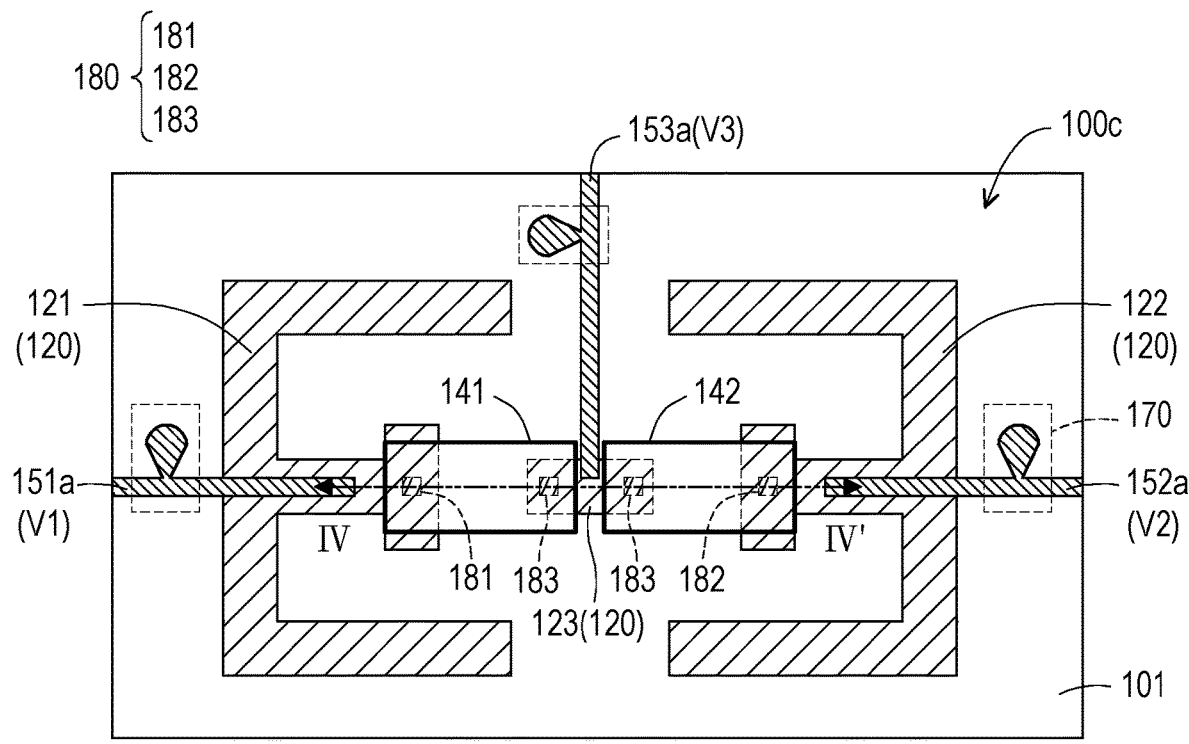
FIG. 4A is a schematic partial top view of an electronic device according to another embodiment of the disclosure.
Figure 4B:
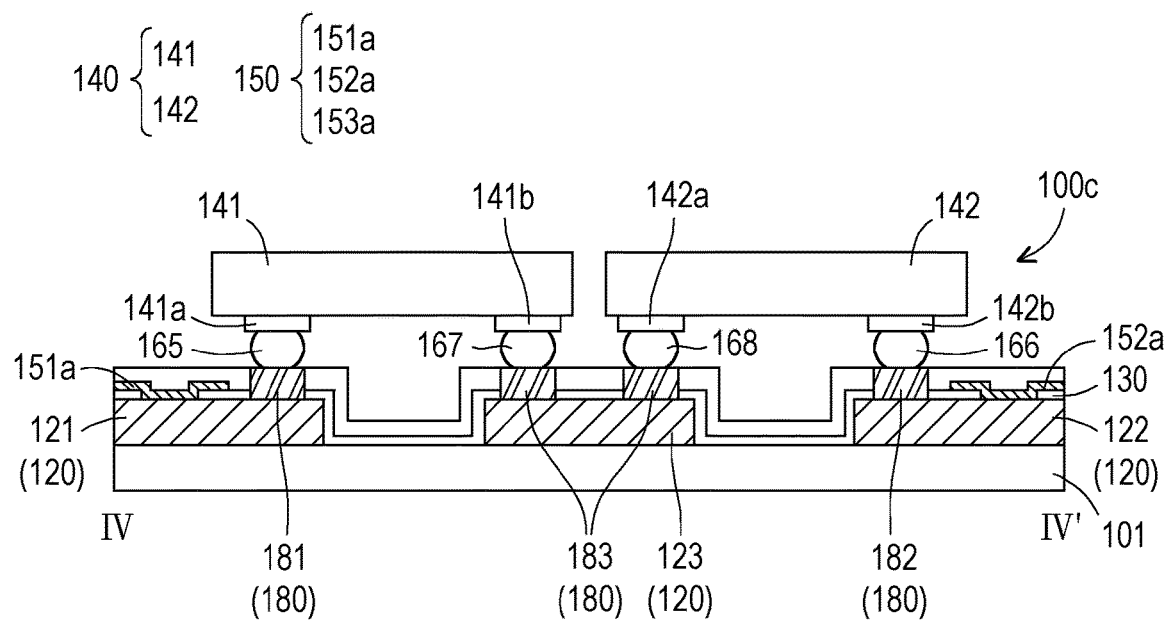
FIG. 4B is a schematic cross-sectional view of the electronic device of FIG. 4A along a section line IV-IV'.

FIG. 4A is a schematic partial top view of an electronic device according to another embodiment of the disclosure. FIG. 4B is a schematic cross-sectional view of the electronic device of FIG. 4A along a section line IV-IV'. Please refer to FIG. 2A, FIG. 2B, FIG. 4A, and FIG. 4B at the same time. A modulation unit 100c of this embodiment is substantially similar to the modulation unit 100a of FIG. 2A and FIG. 2B, so the same and similar components in the two embodiments are not repeated here. The modulation unit 100c of this embodiment is different from the modulation unit 100a in that the first signal line 151a, the second signal line 152a, and the third signal line 153a of this embodiment do not contact the second conductive layer pattern 180.

Specifically, please refer to FIG. 4A and FIG. 4B. In this embodiment, the first insulation layer 130 has multiple openings to expose the first part 121, the second part 122, and the third part 123 of the first conductive layer pattern 120.

In this embodiment, the first signal line 151a, the second signal line 152a, and the third signal line 153a are disposed on the first conductive layer pattern 120 exposed by the first insulation layer 130, so that the first signal line 151a may contact the first part 121, the second signal line 152a may contact the second part 122, and the third signal line 153a may contact the third part 123.

In this embodiment, the second conductive layer pattern 180 is disposed on the first conductive layer pattern 120 exposed by the first insulation layer 130, so that the first pad 181 may contact the first part 121, the second pad 182 may contact the second part 122, and the third pad 183 may contact the third part 123. The first pad 181 does not contact the first signal line 151a, the second pad 182 does not contact the second signal line 152a, and the third pad 183 does not contact the third signal line 153a. The first pad 181 may be electrically connected to the first signal line 151a through the first part 121, the second pad 182 may be electrically connected to the second signal line 152a through the second part 122, and the third pad 183 may be electrically connected to the third signal line through the third part 123 153a.

The second insulation layer 132 is disposed on the first insulation layer 130 to cover the first insulation layer 130, the first signal line 151a, the second signal line 152a, and the third signal line 153a. The second insulation layer 132 may also be disposed in a gap between the first pad 181 and the first signal line 151a, a gap between the second pad 182 and the second signal line 152a, and a gap between the third pad 183 and the third signal line 153a.

Figure 5:
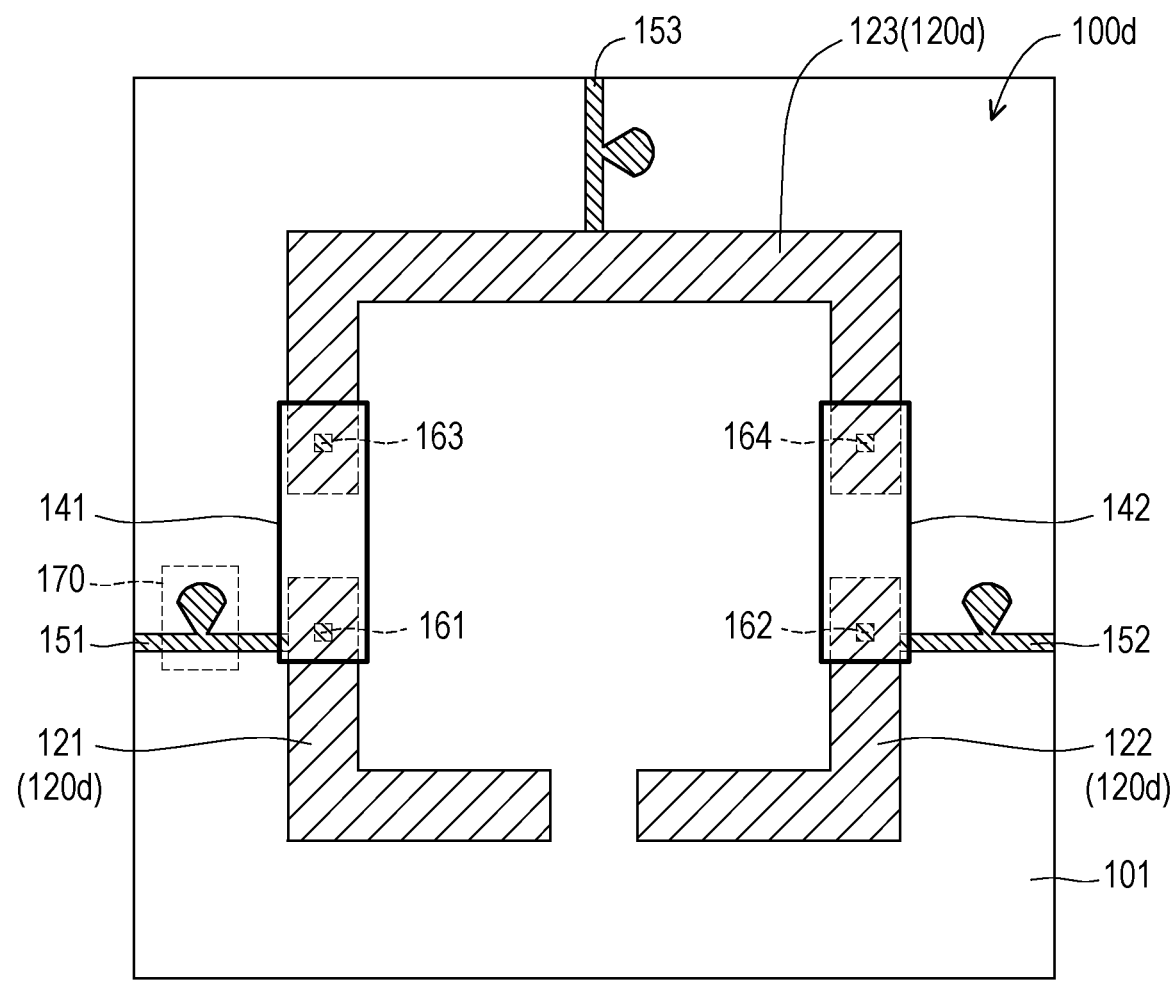
FIG. 5 is a schematic partial top view of an electronic device according to another embodiment of the disclosure.

FIG. 5 is a schematic partial top view of an electronic device according to another embodiment of the disclosure. Please refer to FIG. 1A and FIG. 5 at the same time. A modulation unit 100d of this embodiment is substantially similar to the modulation unit 100 of FIG. 1A, so the same and similar components in the two embodiments are not repeated here. The modulation unit 100d of this embodiment is different from the modulation unit 100 in that in each modulation unit 100d of this embodiment, a pattern of a first conductive layer pattern 120d may be roughly regarded as a hollow square shape.

Specifically, please refer to FIG. 5. In the schematic top view of the modulation unit 100d, the pattern of the first part 121 and the pattern of the second part 122 may be regarded as L-shaped, and the pattern of the third part 123 may be regarded as C-shaped, but not limited thereto. The pattern of the first part 121, the pattern of the second part 122, and the pattern of the third part 123 are separated from each other, and the pattern of the first part 121, the pattern of the second part 122, and the pattern of the third part 123 may be roughly formed into a hollow square shape, but not limited thereto. In addition, in this embodiment, the first electronic element 141 and the second electronic element 142 are respectively disposed on two sides of the pattern of the first conductive layer pattern 120d, but not limited thereto.

FIG. 6 is a schematic partial top view of an electronic device according to another embodiment of the disclosure. Please refer to FIG. 2A and FIG. 6 at the same time. A modulation unit 100e of this embodiment is substantially similar to the modulation unit 100 of FIG. 1A, so the same and similar components in the two embodiments are not repeated here. The modulation unit 100e of this embodiment is different from the modulation unit 100 in that in each modulation unit 100e of this embodiment, a first electronic element 141d and a second electronic element 142d both have 3 pads (not shown).

Specifically, please refer to FIG. 6. In the schematic top view of the modulation unit 100e, the first conductive layer pattern 120e includes the first part 121, the second part 122, and the third part 123. The pattern of the first part 121 and the pattern of the second part 122 may be regarded as a solid square shape, and the pattern of the third part 123 may be regarded as ⊥- -shaped, but not limited thereto. The pattern of the first part 121, the pattern of the second part 122, and the pattern of the third part 123 are separated from each other, and the pattern of the first part 121, the pattern of the second part 122, and the pattern of the third part 123 may be roughly formed into a ⊟ shape (that is, the pattern of the first conductive layer pattern 120e may be roughly regarded as the ⊟ shape), but not limited thereto. In addition, in this embodiment, the first electronic element 141d and the second electronic element 142d are respectively disposed on two sides of the pattern of the first conductive layer pattern 120e, but not limited thereto.

In this embodiment, the second conductive layer pattern 180d is disposed on the first conductive layer pattern 120e and includes the first pad 181 and the second pad 182 separated from each other. The first pad 181 may be disposed corresponding to the first part 121, and the second pad 182 may be disposed corresponding to the second part 122. The bonding pad 161, the bonding pad 162, the bonding pad 163, and the bonding pad 164 are respectively disposed on the third part 123 of the first conductive layer pattern 120e to contact the third part 123. The first electronic element 141 having 3 pads may be bonded to the first conductive layer pattern 120e through the bonding pad 161, the first pad 181, and the bonding pad 163, and the second electronic element 142 having 3 pads may be bonded to the first conductive layer pattern 120e through the bonding pad 162, the second pad 182, and the bonding pad 164.

In this embodiment, since the third signal line 153 may contact and be electrically connected to the third part 123 of the first conductive layer pattern 120e, the third signal line 153 needs to be additionally provided with the radio frequency choke 170. In addition, the first signal line 151d electrically connected to the first pad 181 and the second signal line 152d electrically connected to the second pad 182 do not need to be additionally provided with any radio frequency choke.

Figure 7:
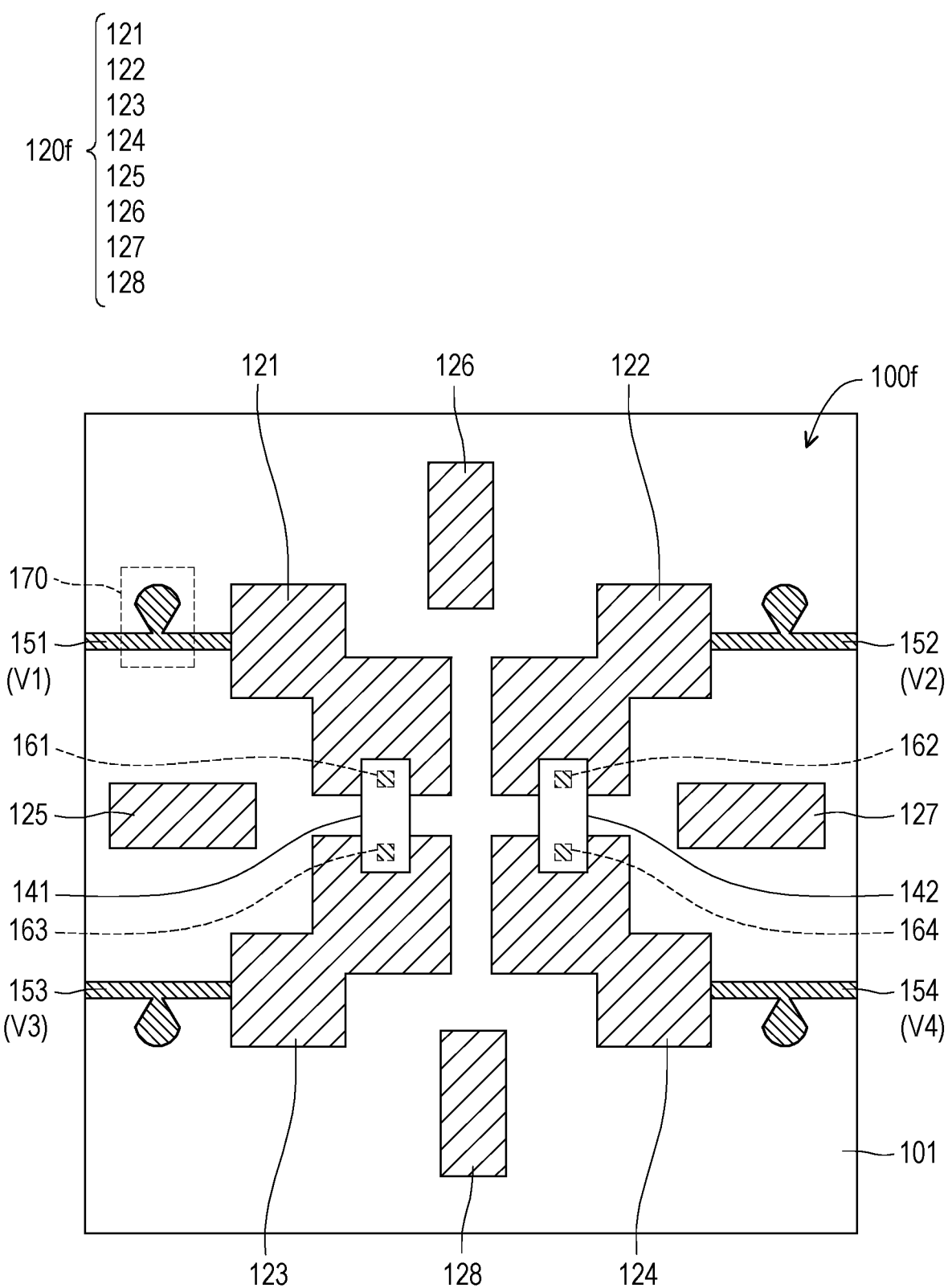
FIG. 7 is a schematic partial top view of an electronic device according to another embodiment of the disclosure.

FIG. 7 is a schematic partial top view of an electronic device according to another embodiment of the disclosure. Please refer to FIG. 1A and FIG. 7 at the same time. A modulation unit 100f of this embodiment is substantially similar to the modulation unit 100 of FIG. 1A, so the same and similar components in the two embodiments are not repeated here. The modulation unit 100f of this embodiment is different from the modulation unit 100 in that each modulation unit 100f of this embodiment further includes a fourth signal line 154, and a first conductive layer pattern 120f further includes a fourth part 124, a fifth part 125, a fifth part 126, a fifth part 127, and a fifth part 128.

Specifically, please refer to FIG. 7. In this embodiment, the first part 121, the second part 122, the third part 123, the fourth part 124, the fifth part 125, the fifth part 126, the fifth part 127, and the fifth part 128 are separated from each other. The first part 121, the second part 122, the third part 123, and the fourth part 124 are disposed in the middle of the first conductive layer pattern 120f, and the fifth part 125, the fifth part 126, the fifth part 127, and the fifth part 128 are disposed at the periphery of the first conductive layer pattern 120f. The patterns of the first part 121, the second part 122, the third part 123, the fourth part 124, the fifth part 125, the fifth part 126, the fifth part 127, and the fifth part 128 may be roughly formed into a ✳ shape (that is, the pattern of the first conductive layer pattern 120f may be roughly regarded as the ✳ shape), but not limited thereto.

In this embodiment, the bonding pad 161 is disposed on the first part 121, the bonding pad 162 is disposed on the second part 122, the bonding pad 163 is disposed on the third part 123, and the bonding pad 164 is disposed on the fourth part 124. The first electronic element 141 may be bonded to the first conductive layer pattern 120f through the bonding pad 161 and the bonding pad 163, and the second electronic element 142 may be bonded to the first conductive layer pattern 120f through the bonding pad 162 and the bonding pad 164.

In this embodiment, the first signal line 151 may contact and be electrically connected to the first part 121, the second signal line 152 may contact and be electrically connected to the second part 122, the third signal line 153 may contact and be electrically connected to the third part 123, and the fourth signal line 154 may contact and be electrically connected to the fourth part 124. The first signal line 151 may provide the first voltage V1 to the first electronic element 141, and the third signal line 153 may provide the third voltage V3 to the first electronic element 141. The second signal line 152 may provide the second voltage V2 to the second electronic element 142, and the fourth signal line 154 may provide a fourth voltage V4 to the second electronic element 142.

Figure 8:
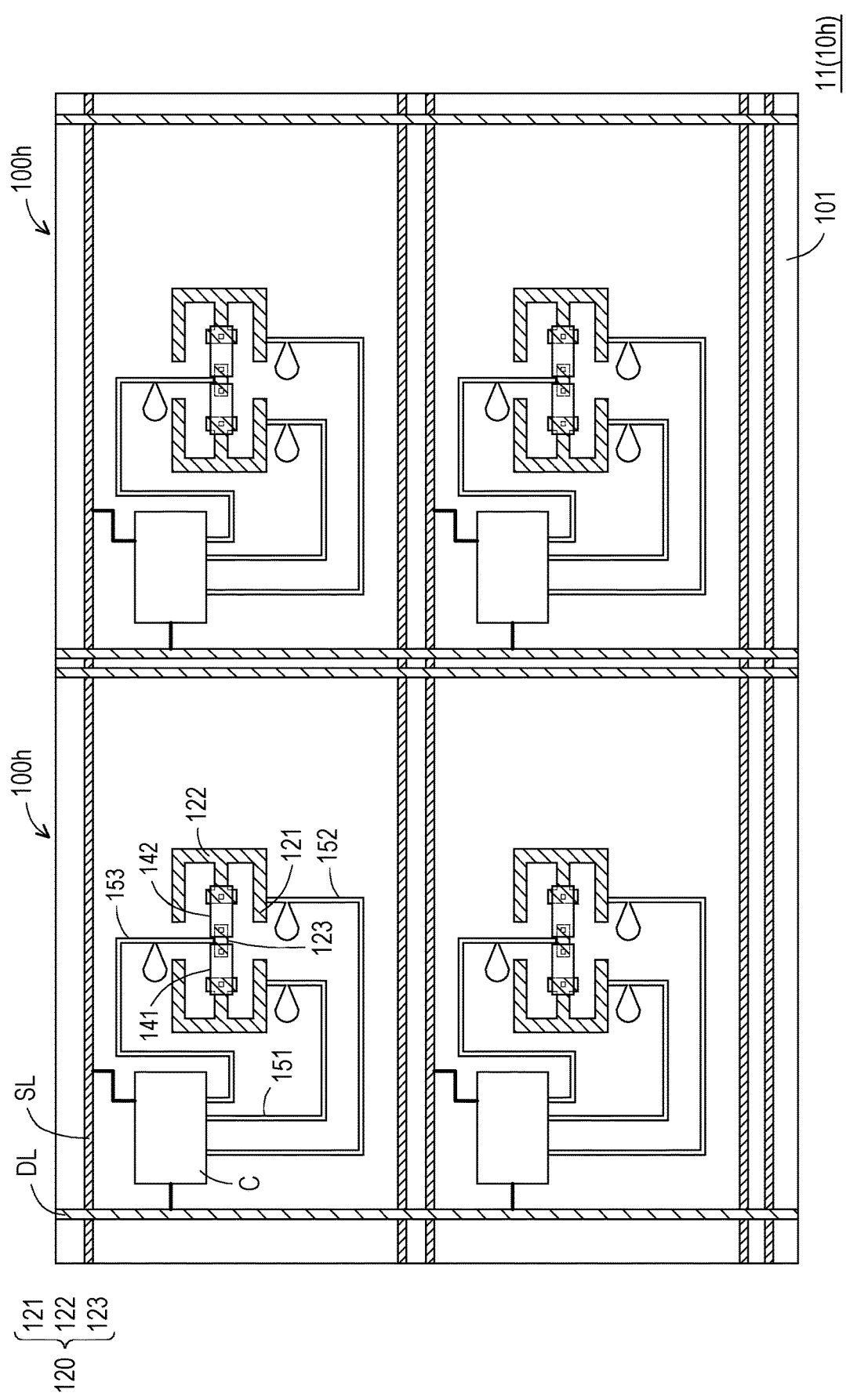
FIG. 8 is a schematic partial top view of an electronic device according to another embodiment of the disclosure.

FIG. 8 is a schematic partial top view of an electronic device according to another embodiment of the disclosure. Please refer to FIG. 1A and FIG. 8 at the same time. An electronic device 10g and a modulation unit 100g of this embodiment are substantially similar to the electronic device 10 and the modulation unit 100 of FIG. 1A and FIG. 1B, so the same and similar components in the two embodiments are repeated here. The electronic device 10g and the modulation unit 100g of this embodiment are different from the electronic device 10 and the modulation unit 100 in that the electronic device 10g of this embodiment further includes multiple scanning lines SL, multiple signal lines DL, and a modulation module 11, and each modulation unit 100g further includes a chip C.

Specifically, please refer to FIG. 8. The modulation module 11 includes multiple modulation units 100g arranged in an array, wherein the modulation units 100g disposed in the modulation module 11 may be the same or different. The scanning lines SL and the signal lines DL are respectively disposed on the substrate 101. The scanning lines SL and the signal lines DL are interleaved with each other to define the modulation units 100g arranged in an array.

In this embodiment, since the scanning lines SL may be electrically connected to the chip C, the signal lines DL may be electrically connected to the chip C, and the first part 121, the second part 122, and the third part 123 in the first conductive layer pattern 120 may be respectively electrically connected to the chip C through the first signal line 151, the second signal line 152, and the third signal line 153, the chip C may independently regulate each modulation unit 100g. In this embodiment, the chip C may be, for example, a chip packaged by an integrated circuit (IC) or multiple thin film transistor (TFT) elements, or a die formed by multiple TFT elements. The chip C includes a driving circuit, and the driving circuit may be respectively electrically connected to the first signal line 151, the second signal line 152, and the third signal line 153.

Figure 9:
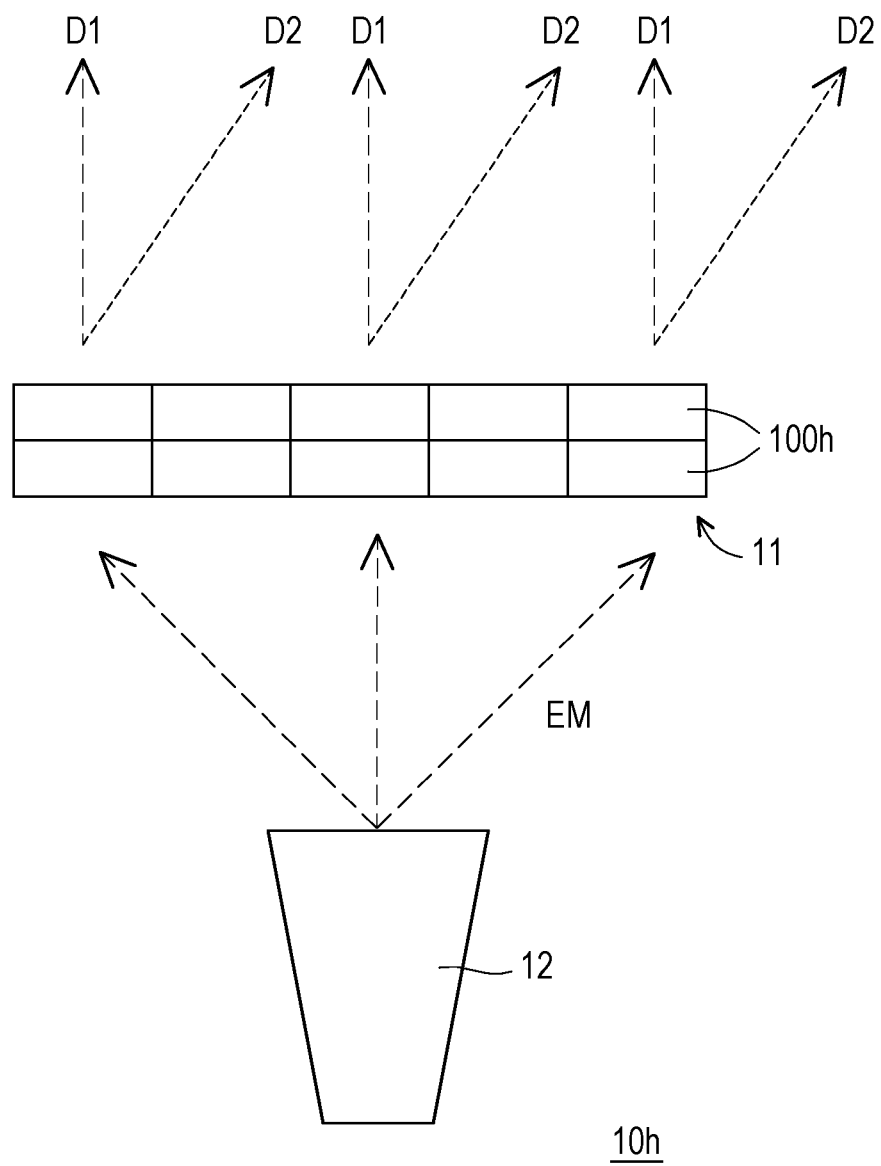
FIG. 9 is a schematic partial top view of an electronic device according to another embodiment of the disclosure.

FIG. 9 is a schematic partial top view of an electronic device according to another embodiment of the disclosure. Please refer to FIG. 8 and FIG. 9 at the same time. An electronic device 10h of this embodiment is substantially similar to the electronic device 10g of FIG. 8, so the same and similar components in the two embodiments are not repeated here. The electronic device 10h in this embodiment is different from the electronic device 10g in that the electronic device 10h in this embodiment further includes an emission source 12.

Specifically, please refer to FIG. 9. In this embodiment, the emission source 12 is configured to emit a signal EM (for example, an electromagnetic wave signal or a light signal).

The signal EM (for example, the electromagnetic wave signal or the light signal) may propagate in, for example, a free space in any direction, but not limited thereto. In some embodiments, the signal EM (for example, the electromagnetic wave signal or the light signal) may also propagate in a wave-guided structure (not shown), wherein the wave-guided structure is, for example, a transmission line, a dielectric-filled waveguide, or a gas-filled waveguide, but not limited thereto.

In this embodiment, when each modulation unit 100h in the modulation module 11 receives the signal EM (for example, the electromagnetic wave signal or the light signal) emitted by the emission source 12, the modulation module 11 may regulate the phase, the amplitude, or the polarization state of the signal EM (for example, the electromagnetic wave signal or the light signal) incident to each modulation unit 100h, so that each modulation unit 100h outputs the signal EM (for example, the electromagnetic wave signal or the light signal) to the same direction (that is, a first direction D1 or a second direction D2), but not limited thereto. In some embodiments, after the modulation module 11 regulates the phase of the signal EM (for example, the electromagnetic wave signal or the light signal) incident to each modulation unit 100h, each modulation unit 100h may also output the signal EM (for example, the electromagnetic wave signal or the light signal) to the same location (not shown).

In this embodiment, the electronic device 10h may be applied to an antenna device, a display device for images, or a 5G millimeter-wave amplifier, but not limited thereto.

In addition, although the modulation module 11 in this embodiment is disposed outside the emission source 12 to regulate the phase of the signal EM (for example, the electromagnetic wave signal or the light signal) emitted by the emission source 12, the disclosure does not limit the configuration location of the modulation module 11. In some embodiments, a modulation module may be disposed in an emission source to regulate a phase of a signal (for example, an electromagnetic wave signal or a light signal) before emitting the signal, as shown in FIG. 10.

Figure 10:
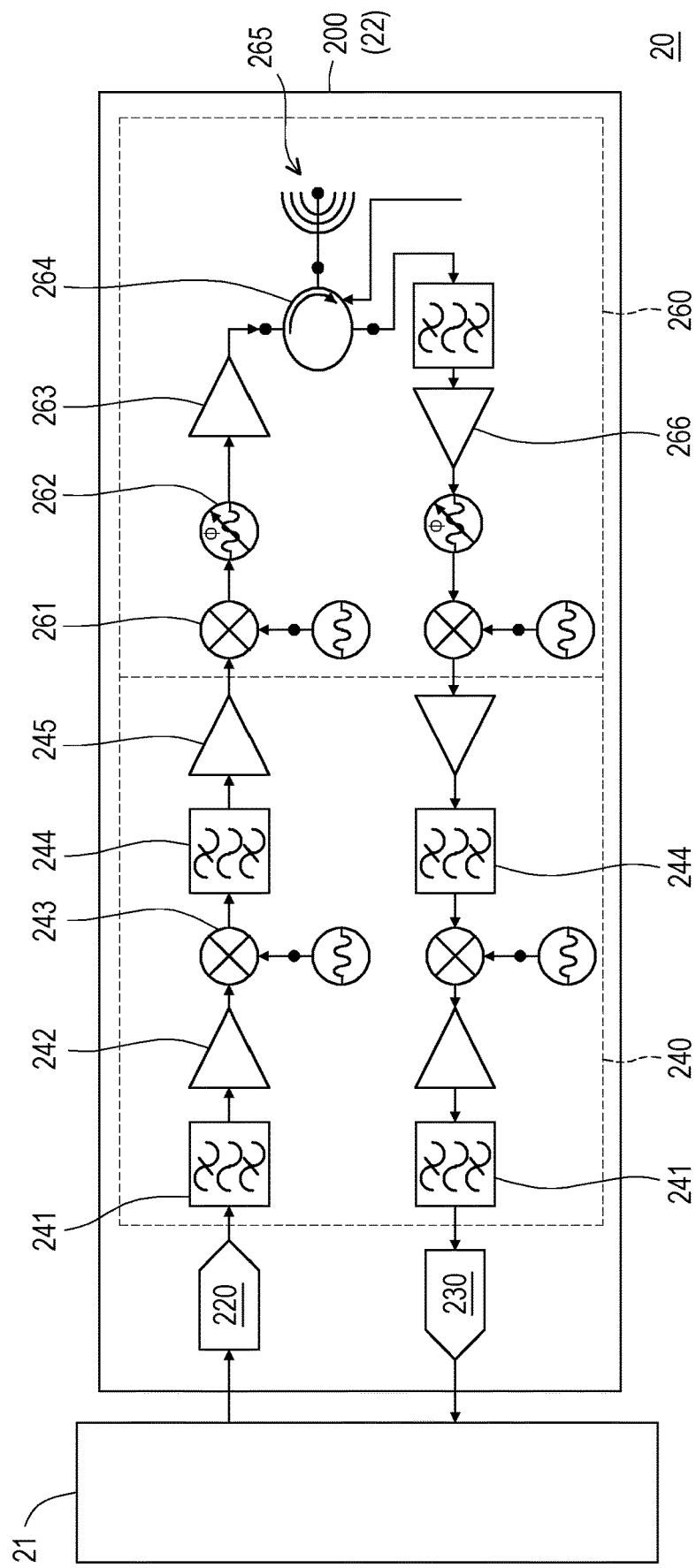
FIG. 10 is a functional schematic view of an electronic device according to another embodiment of the disclosure.

FIG. 10 is a functional schematic view of an electronic device according to another embodiment of the disclosure.

Please refer to FIG. 10. An electronic device 20 of this embodiment may be regarded as an antenna device and includes a baseband circuit 21 and a phase array antenna 22. Specifically, the phase array antenna 22 includes multiple antennas 200, and each antenna 200 includes a converter 220, a converter 230, an intermediate frequency circuit 240 and a high frequency circuit 260. The intermediate frequency circuit 240 includes a filter 241, an amplifier 242, a mixer 243, a local oscillator 244, and an amplifier 245. The high frequency circuit 260 includes a mixer 261, a phase shifter 262, a power amplifier 263, a diplexer 264, an antenna unit 265, and a low noise amplifier 266.

In this embodiment, when the electronic device 20 emits a signal, the baseband circuit 21 first converts the signal to the intermediate frequency circuit 240 through the converter 220, the signal is then transmitted to the high frequency circuit 260 through the filter 241, the amplifier 242, the mixer 243, and the local oscillator 244 in the intermediate frequency circuit 240, then through the mixer 261, the phase shifter 262, the power amplifier 263, and the diplexer 264 in the high frequency circuit 260, and an electromagnetic wave signal is finally emitted to the outside through the antenna unit 265. On the contrary, when the electronic device 20 receives a signal, the antenna unit 265 is first used to receive an electromagnetic wave signal from the outside, and the signal is then transmitted to the baseband circuit 21 sequentially through the high frequency circuit 260, the intermediate frequency circuit 240, and the converter 230. A modulation module (not shown) or a modulation unit (not shown) may be disposed in the antenna unit 265 to regulate the phase, the bandwidth, the intensity, or the polarization state of the electromagnetic wave signal before emitting the electromagnetic wave signal.

Figure 11:
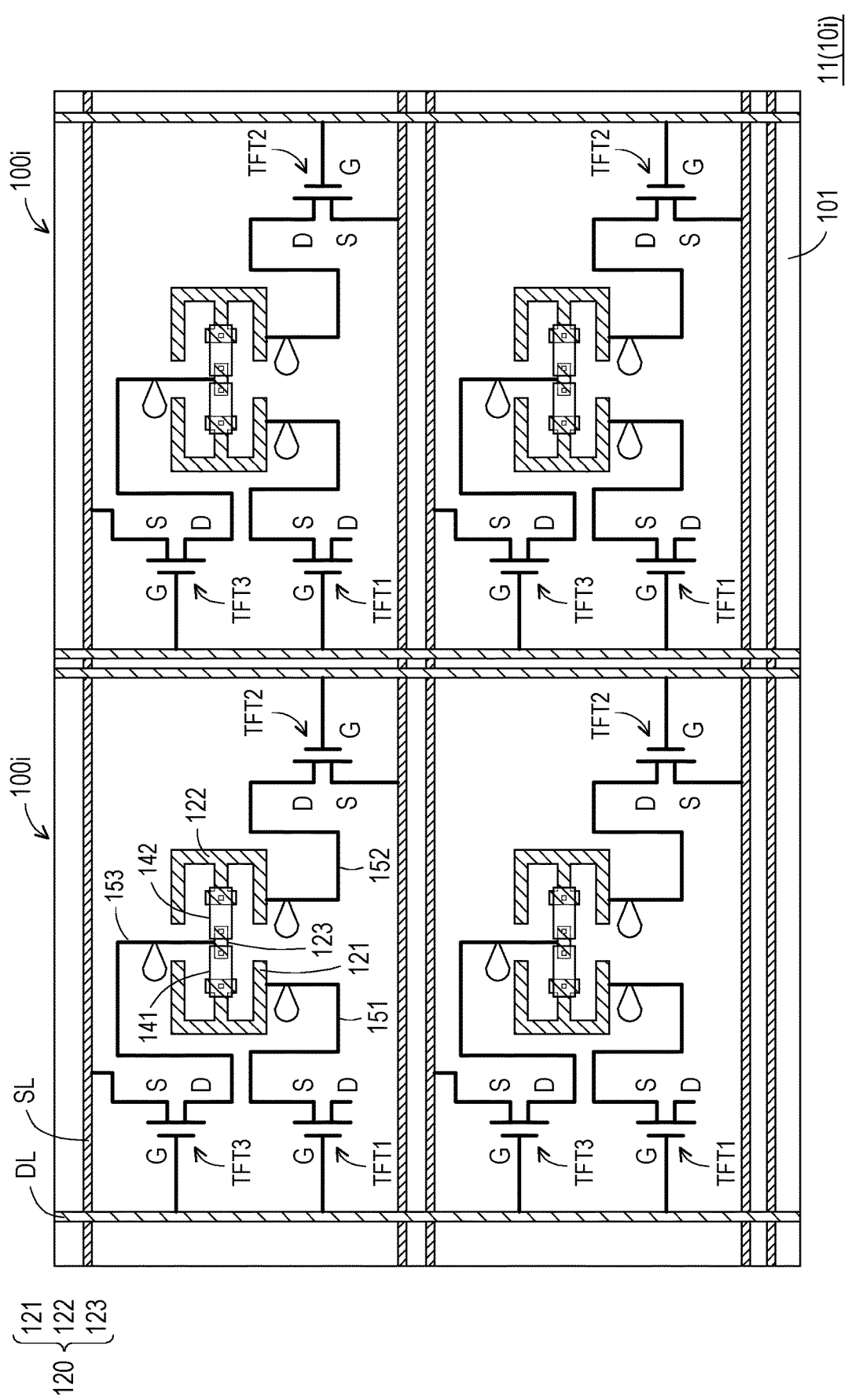
FIG. 11 is a schematic partial top view of an electronic device according to another embodiment of the disclosure.

FIG. 11 is a schematic partial top view of an electronic device according to another embodiment of the disclosure. Please refer to FIG. 1A and FIG. 11 at the same time. An electronic device 10i and a modulation unit 100i of this embodiment are substantially similar to the electronic device 10 and the modulation unit 100 of FIG. 1A and FIG. 1B, so the same and similar components in the two embodiments are not repeated here. The electronic device 10i and the modulation unit 100i of this embodiment are different from the electronic device 10 and the modulation unit 100 in that the electronic device 10i of this embodiment further includes multiple scanning lines SL, multiple signal lines DL, and a modulation module 11i, and each modulation unit 100i further includes multiple transistors TFT1, TFT2, and TFT3.

Specifically, please refer to FIG. 11. The modulation module 11i includes multiple modulation units 100i arranged in an array, wherein the modulation units 100i disposed in the modulation module 11i may be the same or different. The scanning lines SL and the signal lines DL are respectively disposed on the substrate 101. The scanning lines SL and the signal lines DL are interleaved with each other to define the modulation units 100i arranged in an array.

In this embodiment, the scanning lines SL may be electrically connected to gates G in the transistor TFT1, the transistor TFT2, and the transistor TFT3, the signal lines DL may be electrically connected to sources S in the transistor TFT1, the transistor TFT2, and the transistor TFT3, and the first conductive layer pattern 120 may be electrically connected to drains D in the transistor TFT1, the transistor TFT2, and the transistor TFT3. The transistor TFT1, the transistor TFT2, and the transistor TFT3 may be respectively electrically connected to the first signal line 151, the second signal line 152, and the third signal line 153 to independently regulate each modulation unit 100i.

Figure 12:
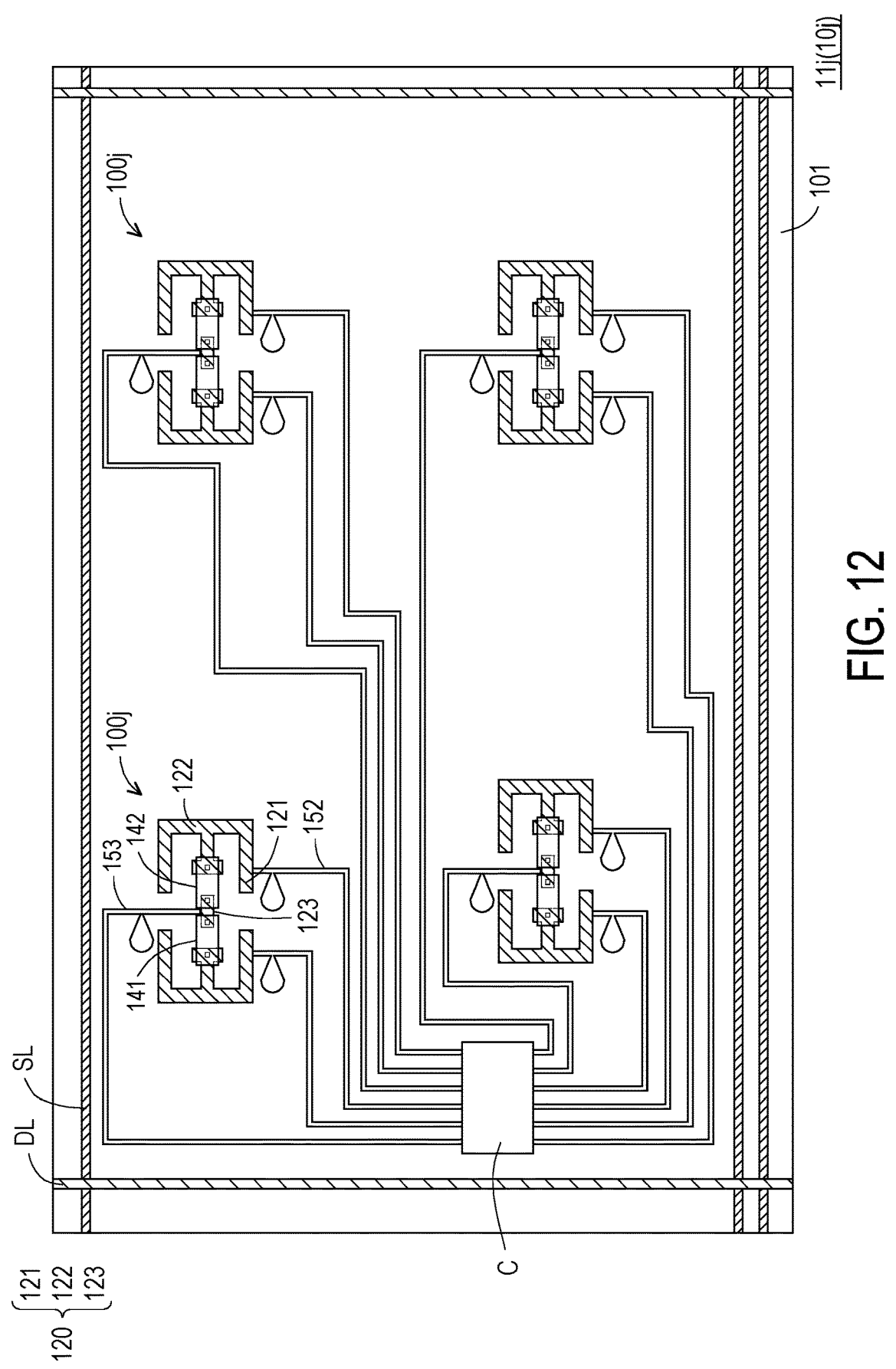
FIG. 12 is a schematic partial top view of an electronic device according to another embodiment of the disclosure.

FIG. 12 is a schematic partial top view of an electronic device according to another embodiment of the disclosure. Please refer to FIG. 1A and FIG. 12 at the same time. An electronic device 10j and a modulation unit 100j of this embodiment are substantially similar to the electronic device 10 and the modulation unit 100 of FIG. 1A and FIG. 1B, so the same and similar components in the two embodiments are not repeated here. The electronic device 10j and the modulation unit 100j of this embodiment are different from the electronic device 10 and the modulation unit 100 in that the electronic device 10j of this embodiment further includes multiple scanning lines SL, multiple signal lines DL, a chip C, and a modulation module 11j.

Specifically, please refer to FIG. 12. The modulation module 11j includes multiple modulation units 100j arranged in an array, wherein the modulation units 100j disposed in the modulation module 11j may be the same or different. The scanning lines SL and the signal lines DL are respectively disposed on the substrate 101. The scanning lines SL and the signal lines DL are interleaved with each other to define the modulation units 100j.

In this embodiment, the chip C may be, for example, a chip packaged by an IC or multiple TFT elements, or a die formed by multiple TFT elements. The chip C may include a driving circuit. Since the chip C may be respectively electrically connected to the first part 121, the second part 122, and the third part 123 in each modulation unit 100*j* through the first signal line 151, the second signal line 152, and the third signal line 153, the chip C may simultaneously drive multiple modulation units 100*j*.

Figure 13:
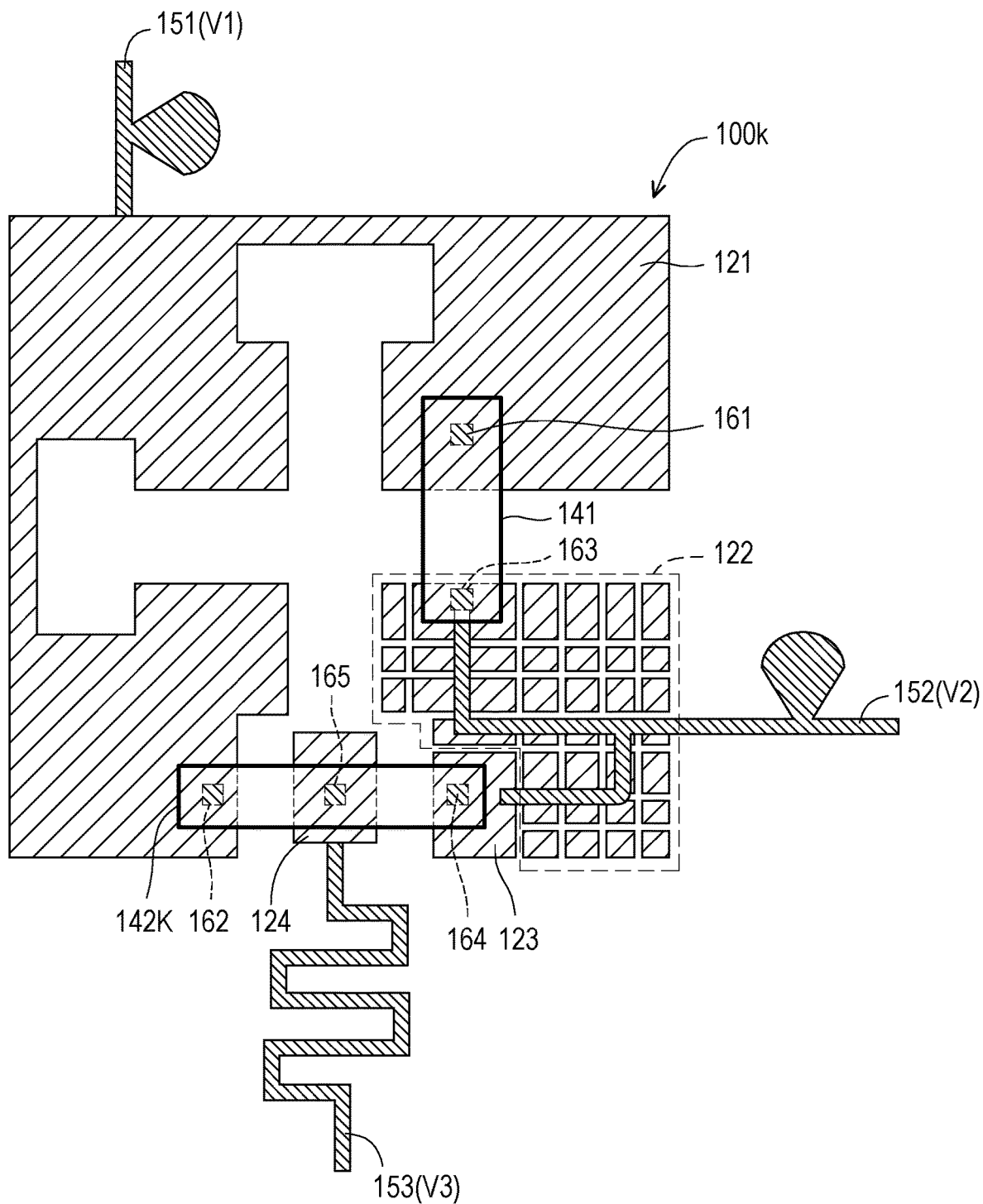
FIG. 13 is a schematic partial top view of an electronic device according to another embodiment of the disclosure.

FIG. 13 is a schematic partial top view of an electronic device according to another embodiment of the disclosure. Please refer to FIG. 1A and FIG. 13 at the same time. A modulation unit 100*k* of this embodiment is substantially similar to the modulation unit 100 of FIG. 1A, so the same and similar components in the two embodiments are not repeated here. The modulation unit 100*k* of this embodiment is different from the modulation unit 100 in that in each modulation unit 100*k* of this embodiment, a first conductive layer pattern 120*k* further includes a fourth part 124*k*, and a second electronic element 142*k* has 3 pads (not shown).

Specifically, please refer to FIG. 13. In this embodiment, the pattern of the first part 121, the pattern of the second part 122, the pattern of the third part 123, and the pattern of the fourth part 124 are separated from each other, and the pattern of the first part 121, the pattern of the second part 122, and the pattern of the third part 123 may be roughly formed into a hollow square shape, but not limited thereto. The pattern of the first part 121 may be regarded as L-shaped, the pattern of the second part 122 may be regarded as a pattern composed of multiple separate solid square shapes, the pattern of the third part 123 may be regarded as a solid square shape, and the pattern of the fourth part 124 may be regarded as a solid square shape, but not limited thereto.

In this embodiment, the bonding pad 161 and the bonding pad 162 are respectively disposed on the first part 121, the bonding pad 163 is disposed on the second part 122, the bonding pad 164 is disposed on the third part 123, and the bonding pad 165 is disposed on the fourth part 124. The first electronic element 141 may be bonded to the first conductive layer pattern 120*k* through the bonding pad 161 and the bonding pad 163, and the second electronic element 142*k* having 3 pads may be bonded to the first conductive layer pattern 120*k* through the bonding pad 162, the bonding pad 164, and the bonding pad 165.

In this embodiment, the first signal line 151 may contact and be electrically connected to the first part 121, the second signal line 152 may respectively contact and be electrically connected to the second part 122 and the third part 123, and the third signal line 153 may contact and be electrically connected to the fourth part 124*k*. The first signal line 151 may provide the first voltage V1 to the first electronic element 141, and the second signal line 152 may provide the second voltage V2 to the first electronic element 141. The first signal line 151 may also provide the first voltage V1 to the second electronic element 142*k*, the second signal line 152 may also provide the second voltage V2 to the second electronic element 142*k*, and the third signal line 153 may provide the third voltage V3 to the second electronic element 142*k*.

Figure 14:
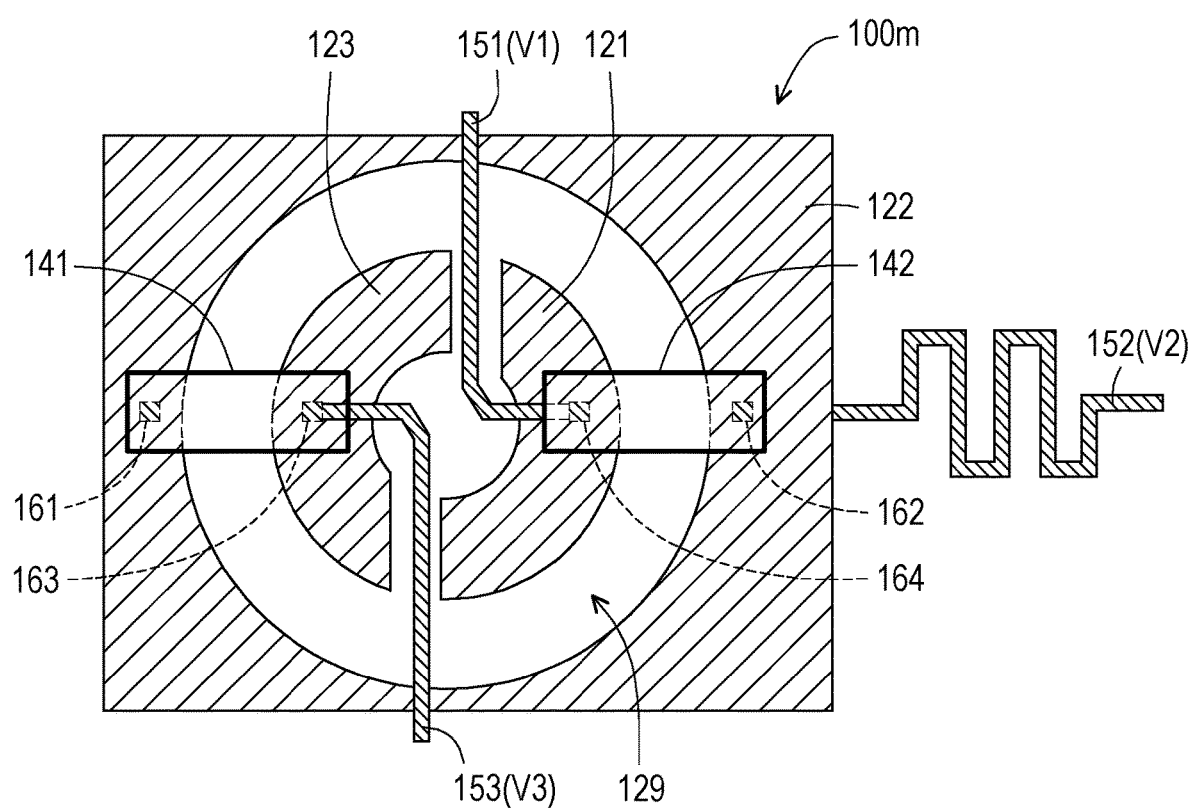
FIG. 14 is a schematic partial top view of an electronic device according to another embodiment of the disclosure.

FIG. 14 is a schematic partial top view of an electronic device according to another embodiment of the disclosure. Please refer to FIG. 1A and FIG. 14 at the same time. A modulation unit 100*m* of this embodiment is substantially similar to the modulation unit 100 of FIG. 1A, so the same and similar components in the two embodiments are not repeated here. The modulation unit 100*m* in this embodiment is different from the modulation unit 100 in that in each modulation unit 100*m* of this embodiment, a first conductive layer pattern 120*m* further includes an opening region 129.

Specifically, please refer to FIG. 14. In this embodiment, the pattern of the first part 121, the pattern of the second part 122, and the pattern of the third part 123 are separated from each other, and the pattern of the first part 121 and the pattern of the third part 123 are disposed in the hollow of the pattern of the second part 122, but not limited thereto. The pattern of the first part 121 may be regarded as a hollow semicircular shape, the pattern of the second part 122 may be regarded as a hollow square shape, and the pattern of the third part 123 may be regarded as a hollow semicircular shape, but not limited thereto.

In this embodiment, the opening region 129 is a region exposed by the first part 121, the second part 122, and the third part 123 of the first conductive layer pattern 120*m*. The sum of the area of the first part 121, the area of the second part 122, and the area of the third part 123 is greater than the area of the opening region 129.

In this embodiment, the bonding pad 161 and the bonding pad 162 are respectively disposed on the second part 122, the bonding pad 163 is disposed on the third part 123, and the bonding pad 164 is disposed on the first part 121. The first electronic element 141 may be bonded to the first conductive layer pattern 120*m* through the bonding pad 161 and the bonding pad 163, and the second electronic element 142 may be bonded to the first conductive layer pattern 120*m* through the bonding pad 162 and the bonding pad 164.

In this embodiment, the first signal line 151 may contact and be electrically connected to the first part 121, the second signal line 152 may contact and be electrically connected to the second part 122, and the third signal line 153 may contact and be electrically connected to the third part 123. The second signal line 152 may provide the second voltage V2 to the first electronic element 141, and the third signal line 153 may provide the third voltage V3 to the first electronic element 141. The first signal line 151 may provide the first voltage V1 to the second electronic element 142, and the second signal line 152 may also provide the second voltage V2 to the second electronic element 142.

Figure 15:
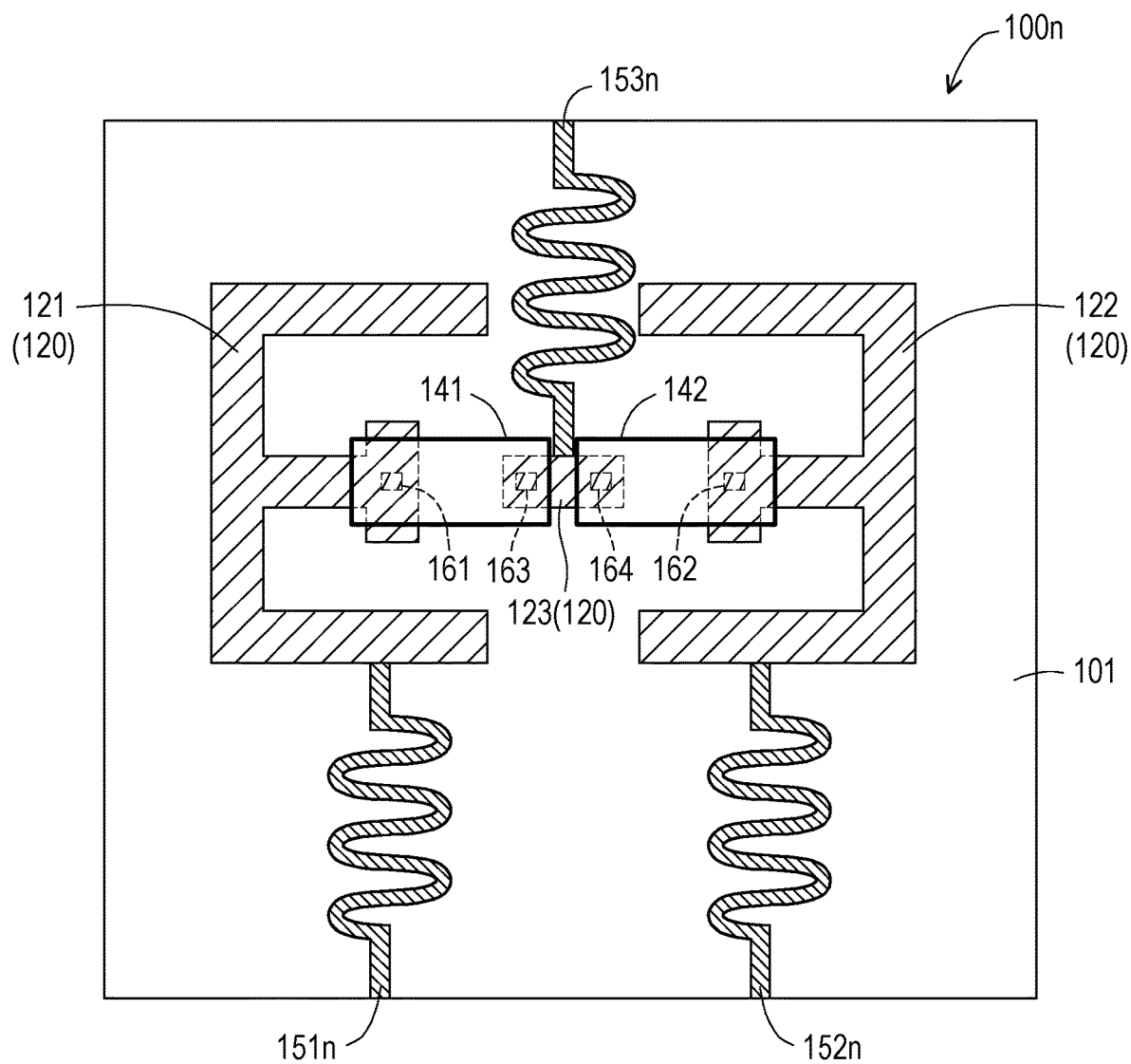
FIG. 15 to FIG. 17 are schematic partial top views of an electronic device according to multiple embodiments of the disclosure.
Figure 16:
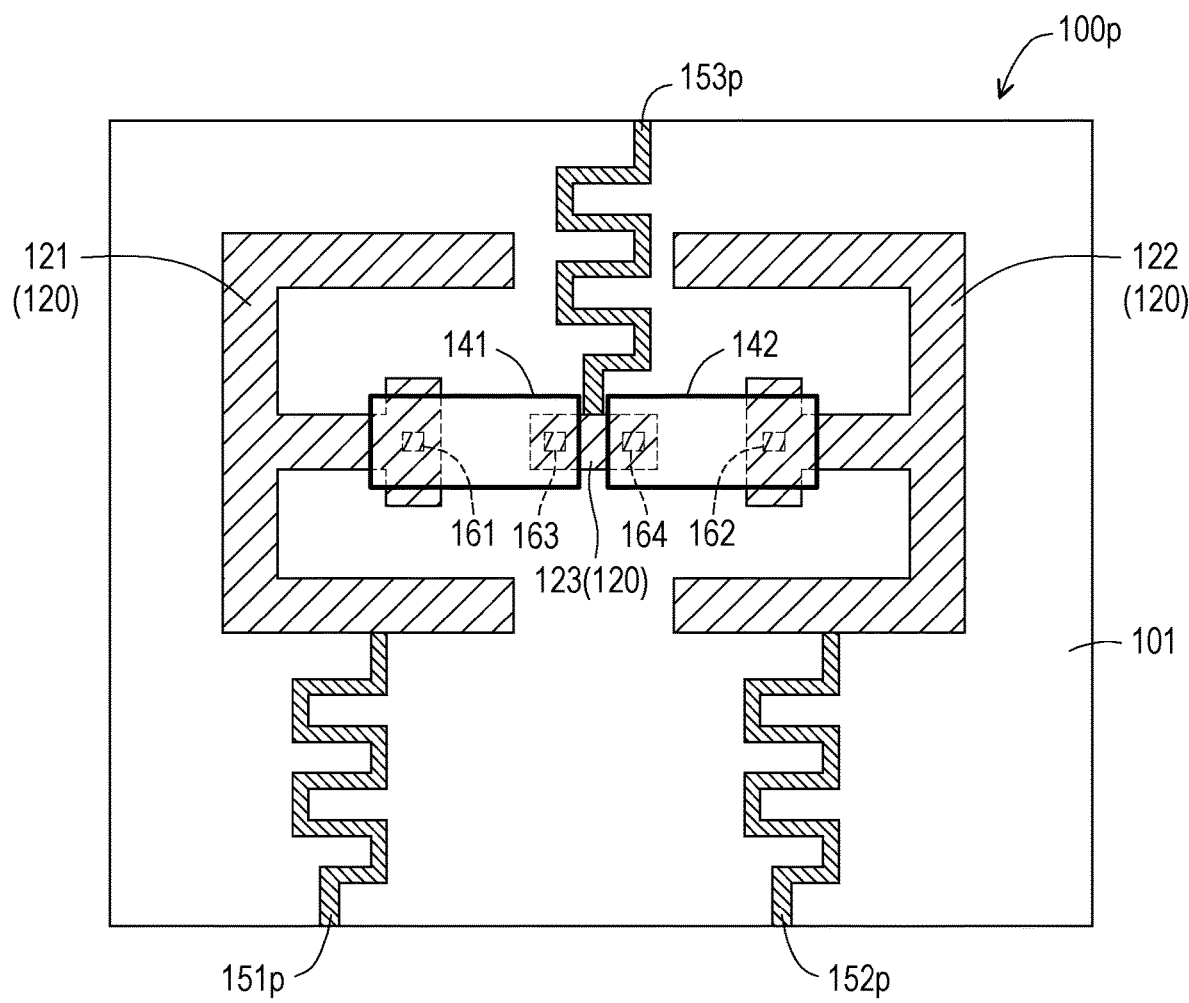
Figure 17:
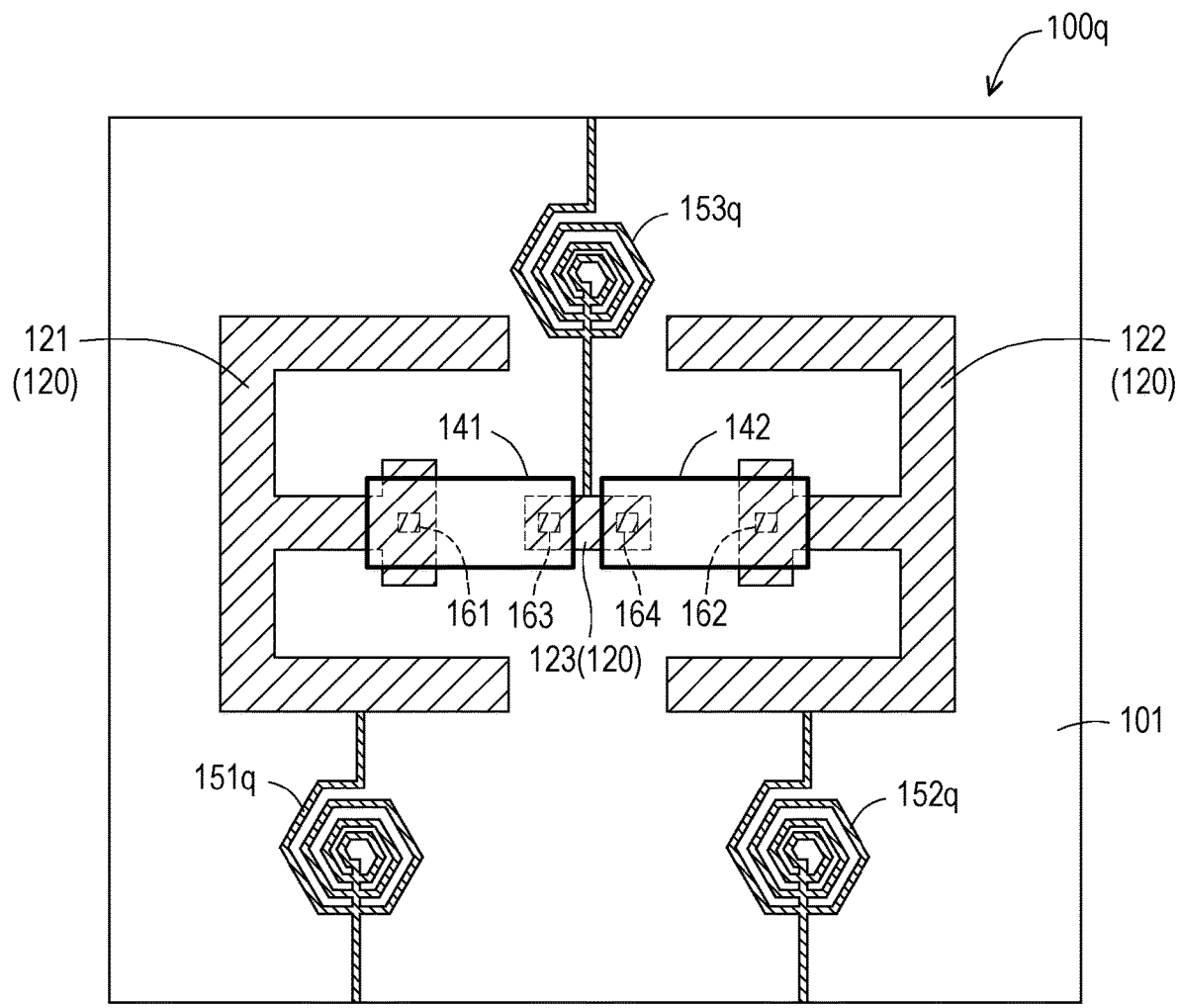

FIG. 15 to FIG. 17 are schematic partial top views of an electronic device according to multiple embodiments of the disclosure. Please refer to FIG. 1A and FIG. 15 to FIG. 17 at the same time. Modulation units 100*n*, 100*p*, and 100*q* of this embodiment are substantially similar to the modulation unit 100 of FIG. 1A, so the same and similar components in the two embodiments are not repeated here. The differences between the modulation units 100*n*, 100*p*, and 100*q* of this embodiment and the modulation unit 100 are as follows.

Please refer to FIG. 15. In the modulation unit 100*n* of this embodiment, the shapes of the contours of a first signal line 151*n*, a second signal line 152*n*, and a third signal line 153*n* may be arc-shaped wavy structures, so that the first signal line 151*n*, the second signal line 152*n*, and the third signal line 153*n* do not need to be additionally provided with radio frequency chokes.

Please refer to FIG. 16. In the modulation unit 100*p* of this embodiment, the shapes of the contours of a first signal line 151*p*, a second signal line 152*p*, and a third signal line 153*p* may be rectangular wavy structures, so that the first signal line 151*p*, the second signal line 152*p*, and the third signal line 153*p* do not need to be additionally provided with radio frequency chokes.

Please refer to FIG. 17. In the modulation unit 100*q* of this embodiment, the shapes of the contours of a first signal line 151*q*, a second signal line 152*q*, and a third signal line 153*q* may be loop structures, so that the first signal line 151*q*, the second signal line 152*q*, and the third signal line 153*q* do not need to be additionally provided with radio frequency chokes.

In summary, in the electronic device of the embodiments of the disclosure, since the first voltage and the third voltage may regulate the own characteristics of the first electronic element, and the second voltage and the third voltage may regulate the own characteristics of the second electronic element, the modulation unit may modulate the intensity, the bandwidth, or the phase of the received signal (for example, the electromagnetic wave signal or the light signal). Then, since the first electronic element and the second electronic element may share the third voltage of the third signal line, the overall circuit configuration of the modulation unit may be relatively simple and not complicated. Furthermore, since the first voltage may be different from the second voltage, and the third voltage may be different from the first voltage and the second voltage, the regulated first electronic element and second electronic element may respectively display various different characteristics, thereby increasing the modulable factor of the modulation unit or increasing the selection of the first electronic element and the second electronic element.

Finally, it should be noted that the above embodiments are only used to illustrate, but not to limit, the technical solutions of the disclosure. Although the disclosure has been described in detail with reference to the above embodiments, persons skilled in the art should understand that the technical solutions described in the above embodiments can still be modified or some or all of the technical features thereof can be equivalently replaced. However, the modifications or replacements do not cause the essence of the corresponding technical solutions to deviate from the scope of the technical solutions of the embodiments of the disclosure.

What is claimed is:

1. An electronic device, comprising:
   a substrate; and
   a plurality of modulation units, disposed on the substrate, wherein each of the modulation units comprises:
   a first electronic element and a second electronic element;
   a first signal line, providing a first voltage to the first electronic element;
   a second signal line, providing a second voltage to the second electronic element;
   a third signal line, providing a third voltage to the first electronic element and/or the second electronic element;
   a first conductive layer pattern, disposed on the substrate; and
   a first insulation layer, disposed on the first conductive layer pattern,
   wherein the first voltage is different from the second voltage, and the third voltage is different from the first voltage and/or the second voltage,
   wherein the first signal line, the second signal line, and the third signal line are disposed on the first insulation layer, wherein the first electronic element and the second electronic element are disposed on the first signal line, the second signal line, and the third signal line.

2. The electronic device according to claim 1, wherein each of the modulation units further comprises:
   a plurality of radio frequency chokes, respectively disposed in the first signal line, the second signal line, and the third signal line to stabilize the first voltage, the second voltage, and the third voltage.

3. The electronic device according to claim 1, wherein the first conductive layer pattern comprises a first part, a second part, and a third part separated from each other, wherein the first signal line is coupled to the first part, the second signal line is coupled to the second part, and the third signal line is coupled to the third part.

4. The electronic device according to claim 3, wherein the first signal line is physically separated from the first part, the second signal line is physically separated from the second part, and the third signal line is physically separated from the third part.

5. The electronic device according to claim 1, wherein each of the modulation units further comprises:
   a second conductive layer pattern, disposed between a signal line and an electronic element, and comprising a first pad, a second pad, and a third pad separated from each other,
   wherein the first pad is electrically connected to the first signal line and the first electronic element, the second pad is electrically connected to the second signal line and the second electronic element, and the third pad is electrically connected to the third signal line and the first electronic element and/or the second electronic element.

6. The electronic device according to claim 5, wherein the first signal line contacts the first pad, the second signal line contacts the second pad, and the third signal line contacts the third pad.

7. The electronic device according to claim 5, wherein each of the modulation units further comprises:
   a conductive hole, penetrating the first insulation layer and electrically connecting the second conductive layer pattern and the first conductive layer pattern.

8. The electronic device according to claim 1,
   wherein the first signal line, the second signal line, and the third signal line are disposed on the first conductive layer pattern.

9. The electronic device according to claim 8, wherein the first conductive layer pattern comprises a first part, a second part, and a third part separated from each other, wherein the first signal line contacts the first part, the second signal line contacts the second part, and the third signal line contacts the third part.

10. The electronic device according to claim 9, wherein each of the modulation units further comprises:
    a second conductive layer pattern, disposed between a signal line and an electronic element, and comprising a first pad, a second pad, and a third pad separated from each other,
    wherein the first pad is electrically connected to the first signal line and the first electronic element, the second pad is electrically connected to the second signal line and the second electronic element, and the third pad is electrically connected to the third signal line and the first electronic element and/or the second electronic element.

11. The electronic device according to claim 10, wherein the first pad contacts the first part, the second pad contacts the second part, and the third pad contacts the third part.

12. The electronic device according to claim 1, wherein each of the modulation units further comprises:
    a plurality of transistors, respectively electrically connected to the first signal line, the second signal line, and the third signal line.

13. The electronic device according to claim 1, wherein each of the modulation units further comprises:

a driving circuit, respectively electrically connected to the first signal line, the second signal line, and the third signal line.

14. The electronic device according to claim 1, further comprising:
an emission source, configured to emit a signal,
wherein each of the modulation units receives the signal, and modulates a phase, an amplitude, or a polarization state of the signal.

15. The electronic device according to claim 1, wherein the first electronic element and the second electronic element comprise capacitors, inductors, or resistors.

* * * * *